United States Patent
Lee et al.

(10) Patent No.: US 8,728,889 B2
(45) Date of Patent: May 20, 2014

(54) CONTACT STRUCTURE AND MANUFACTURING METHOD THEREOF

(71) Applicants: Ho-Ki Lee, Seongnam-si (KR);
Gwang-Hyun Baek, Seoul (KR);
Du-Chul Oh, Hwaseong-si (KR);
Jin-Kwan Lee, Seoul (KR); Ki-Jeong Kim, Hwaseong-si (KR)

(72) Inventors: Ho-Ki Lee, Seongnam-si (KR);
Gwang-Hyun Baek, Seoul (KR);
Du-Chul Oh, Hwaseong-si (KR);
Jin-Kwan Lee, Seoul (KR); Ki-Jeong Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/803,354

(22) Filed: Mar. 14, 2013

(65) Prior Publication Data
US 2013/0270714 A1    Oct. 17, 2013

(30) Foreign Application Priority Data

Apr. 13, 2012    (KR) .................. 10-2012-0038631

(51) Int. Cl.
*H01L 21/336*    (2006.01)
(52) U.S. Cl.
USPC ........... 438/257; 438/261; 438/264; 257/324; 257/326; 257/E29.309
(58) Field of Classification Search
USPC .................. 438/257, 261, 264; 257/324, 326, 257/E29.309
See application file for complete search history.

(56) References Cited

U.S. PATENT DOCUMENTS

| | | | |
|---|---|---|---|
| 5,739,587 A | 4/1998 | Sato | |
| 6,262,376 B1 | 7/2001 | Hurwitz et al. | |
| 6,727,544 B2* | 4/2004 | Endoh et al. | 257/315 |
| 6,870,215 B2* | 3/2005 | Endoh et al. | 257/316 |
| 7,910,432 B2 | 3/2011 | Tanaka et al. | |
| 8,178,917 B2* | 5/2012 | Tanaka et al. | 257/324 |
| 8,569,182 B2* | 10/2013 | Park et al. | 438/738 |
| 2007/0252201 A1* | 11/2007 | Kito et al. | 257/331 |
| 2008/0149913 A1* | 6/2008 | Tanaka et al. | 257/5 |
| 2009/0230462 A1* | 9/2009 | Tanaka et al. | 257/326 |
| 2010/0133598 A1 | 6/2010 | Chae et al. | |
| 2010/0213526 A1 | 8/2010 | Wada et al. | |
| 2010/0320526 A1 | 12/2010 | Kidoh et al. | |
| 2011/0121403 A1* | 5/2011 | Lee et al. | 257/390 |
| 2012/0119283 A1* | 5/2012 | Lee et al. | 257/316 |
| 2012/0119287 A1* | 5/2012 | Park et al. | 257/329 |
| 2013/0048984 A1* | 2/2013 | Yang | 257/49 |

FOREIGN PATENT DOCUMENTS

| | | | |
|---|---|---|---|
| KR | 1020110001527 A | 1/2011 | |
| KR | 1020110015338 A | 2/2011 | |

* cited by examiner

*Primary Examiner* — Telly Green
(74) *Attorney, Agent, or Firm* — F.Chau & Associates, LLC

(57) ABSTRACT

A semiconductor memory device includes conductive patterns vertically stacked on the substrate and having pad regions extended further at edge portions of the conductive patterns as the conductive patterns descend from an uppermost conductive pattern to a lowermost conductive pattern, a first contact plug disposed on a first pad region of the lowermost conductive pattern, a buffer conductive pattern disposed on a second pad region positioned above the first pad region, and a second contact plug formed on the buffer conductive pattern.

16 Claims, 20 Drawing Sheets

CBL    CR

CR    CBL    CR

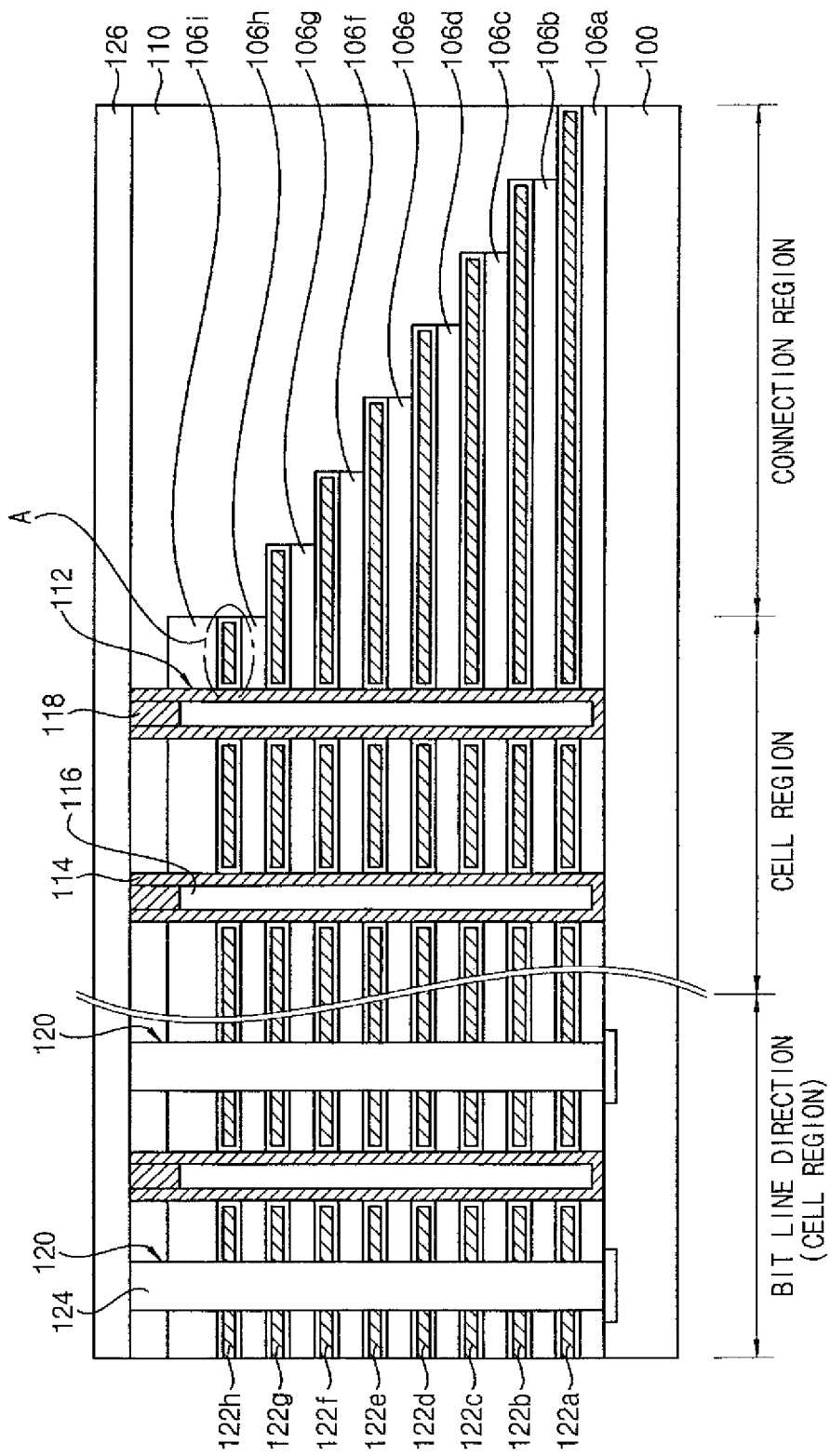

CONTACT STRUCTURE AND MANUFACTURING METHOD THEREOF

CROSS-REFERENCE TO RELATED APPLICATION

This application claims priority under 35 U.S.C. §119 to Korean Patent Application No. 10-2012-0038631 filed on Apr. 13, 2012 in the Korean Intellectual Property Office (KIPO), the entire disclosure of which is incorporated by reference herein in its entirety.

TECHNICAL FIELD

The present inventive concept relates to a contact structure, more particularly, to a contact structure and a manufacturing method thereof.

DESCRIPTION OF THE RELATED ART

In recent years, vertical memory devices in which memory cells are laminated in a vertical direction on a substrate have been developed. Vertical memory devices may include contact plugs having different vertical heights to electrically connect the memory cells to peripheral circuits.

SUMMARY

Exemplary embodiments provide contact structures having various vertical heights through a simple process using one photolithographic process and manufacturing method thereof.

In an exemplary embodiment according to the inventive concept, a conductive structure including insulating interlayer patterns and conductive patterns alternately and repeatedly laminated is formed on a substrate. An upper insulating interlayer is formed on the conductive structure. A hard mask pattern including holes is aligned to pad regions on the insulating interlayer. First contact holes are formed by etching the upper insulating interlayer and an uppermost insulating layer pattern of the insulating interlayer patterns using the hard mask pattern until upper surfaces of a first group of the conductive patterns are exposed. First buffer conductive patterns are selectively formed on the upper surfaces of a first group of the conductive patterns. Second contact holes are formed by etching the upper insulating interlayer using the hard mask patterns and the first buffer conductive patterns until an upper surface of a lowermost conductive pattern is exposed. The contact plugs are formed by filling a conductive material in the first and the second contact holes. The first buffer conductive patterns protect the first group of the conductive patterns in the forming the second contact holes. The conductive patterns include stepped ends providing the pad regions for forming contact plugs.

In an exemplary embodiment according to the inventive concept, an uppermost conductive pattern exposed by one of the first contact holes remains in the forming first contact holes.

In an exemplary embodiment according to the inventive concept, the conductive patterns are extended further descending down to the lowermost conductive patterns such that pad regions are not overlapped with each other.

In an exemplary embodiment according to the inventive concept, the method of manufacturing a semiconductor device, after the forming first buffer conductive patterns, further comprises forming third contact holes by etching the upper insulating interlayer using the hard mask pattern and the first buffer conductive patterns until upper surfaces of a second group of the conductive patterns are exposed, wherein the second group of the conductive patterns are disposed between the first group of the conductive patterns and the lowermost conductive pattern and forming second buffer conductive patterns selectively on the upper surfaces of a second group of the conductive patterns.

In an exemplary embodiment according to the inventive concept, the hard mask pattern includes amorphous carbon or silicon nitride.

In an exemplary embodiment according to the inventive concept, the hard mask pattern is formed by performing one photolithographic process.

In an exemplary embodiment according to the inventive concept, the forming of a hard mask pattern comprises forming a hard mask layer on the upper insulating interlayer, forming a photoresist pattern having photoresist pattern holes aligned to the pad regions using one photolithographic process, and forming the hard mask pattern by etching the hard mask layer using the photoresist pattern.

In an exemplary embodiment according to the inventive concept, the first conductive patterns, the buffer conductive patterns, and the contact plugs include a common metallic material. The metallic material includes at least one selected from tungsten, copper, and aluminum.

In an exemplary embodiment according to the inventive concept, a metallic material is selectively deposited using the upper surfaces of a first group of the conductive patterns as seed layers in the step of forming first buffer conductive patterns.

In an exemplary embodiment according to the inventive concept, the forming first buffer conductive patterns is performed under a process condition that nucleation of the first buffer conductive patterns occurs only on the upper surfaces of a first group of the conductive patterns.

In an exemplary embodiment according to the inventive concept, a tungsten layer is deposited on the upper surfaces of a first group of the conductive patterns at a temperature in a range of about 200° C. to about 350° C. using $WF_6$ gas as a source gas and hydrogen as a reducing agent.

In an exemplary embodiment according to the inventive concept, a nucleation layer is formed on the insulating interlayer pattern and the upper insulating interlayer at a temperature in a range of about 400° C. to about 600° C. using $WF_6$ gas as a source gas and $SiH_4$ or $B_2H_6$ gas as a reducing agent. A tungsten layer is formed on the nucleation layer at a temperature in a range of about 400° C. to about 600° C. using $WF_6$ gas as a source gas and hydrogen as a reducing agent.

In an exemplary embodiment according to the inventive concept, the first buffer conductive patterns have a thickness sufficient to protect the conductive patterns under the first buffer conductive patterns so that the conductive patterns have a sufficient thickness after the forming second contact holes by etching the upper insulating interlayer. The first buffer conductive patterns have a thickness in a range of about 200 Å to about 500 Å.

In an exemplary embodiment according to the inventive concept, a semiconductor memory device comprises conductive patterns vertically stacked on the substrate and having pad regions extended further at edge portions of the conductive patterns as the conductive patterns descend from an uppermost conductive pattern to a lowermost conductive pattern, a first contact plug disposed on a first pad region of the lowermost conductive pattern, a buffer conductive pattern disposed on a second pad region positioned above the first pad region, and a second contact plug formed on the buffer conductive pattern.

In an exemplary embodiment according to the inventive concept, the first and the second contact plugs are formed under a blanket deposition condition, and the buffer conductive pattern is formed under a selective deposition using a conductive pattern under the buffer conductive pattern as a seed layer.

In an exemplary embodiment according to the inventive concept, the second contact plug and the buffer conductive pattern are formed of at least one selected from tungsten, copper, and aluminum.

In an exemplary embodiment according to the inventive concept, the conductive patterns, the buffer conductive pattern, and the second contact plug are formed of tungsten.

BRIEF DESCRIPTION OF THE DRAWINGS

Exemplary embodiments will be more clearly understood from the following detailed description taken in conjunction with the accompanying drawings. FIGS. 1 to 21 represent non-limiting, exemplary embodiments as described herein.

FIG. 1 is a cross-sectional view illustrating a contact structure in accordance with an exemplary embodiment of the inventive concept;

FIGS. 2 to 9 are cross-sectional views illustrating a method of manufacturing the contact structure shown in FIG. 1;

FIGS. 10 and 11 are cross-sectional views illustrating a method of manufacturing a contact structure in accordance with an exemplary embodiment of the inventive concept;

FIG. 12 is a plan view illustrating the arrangement of cells in a memory device;

FIGS. 14 to 24 are cross-sectional views illustrating a method of manufacturing a vertical memory device having a contact structure in accordance with an exemplary embodiment of the inventive concept.

DETAILED DESCRIPTION OF THE EMBODIMENTS

Figure 1:
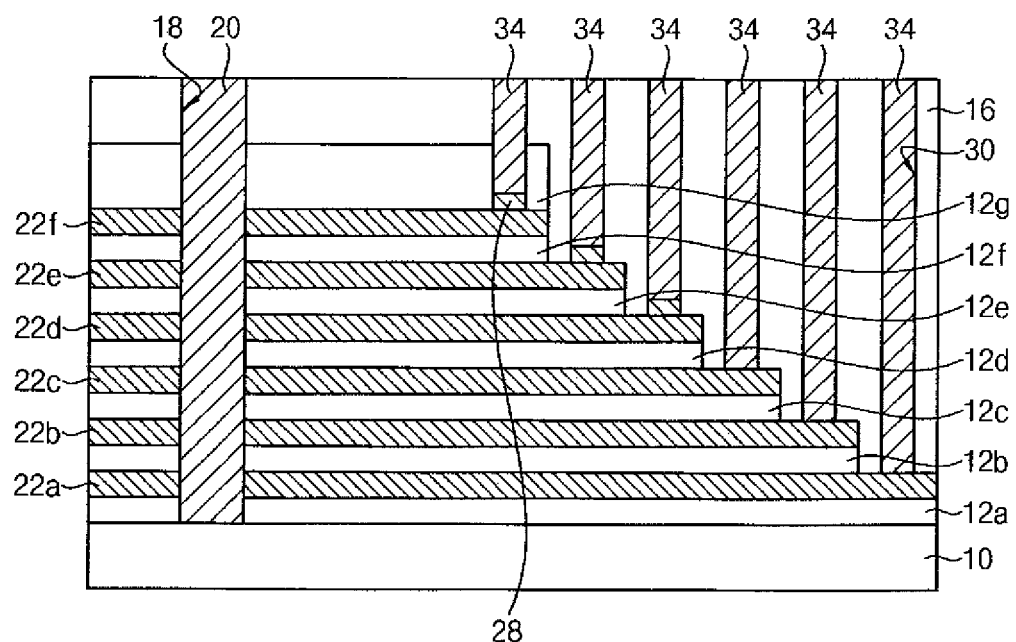

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout. As used herein, the term "and/or" includes any and all combinations of one or more of the associated listed items.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, exemplary embodiments will be described in detail with reference to the accompanying drawings.

FIG. 1 is a cross-sectional view illustrating a contact structure in accordance with an exemplary embodiment of the inventive concept.

Referring to FIG. 1, a step shaped conductive structure is provided on a substrate. The step shaped conductive structure includes insulating interlayer patterns 12a-12g and conductive patterns 22a-22f alternately and repeatedly laminated on the substrate. The number of laminated layers of the insulating interlayer patterns 12a-12g and the conductive patterns 22a-22f is not limited to the above, but any number of the insulating interlayer patterns and the conductive patterns may be used.

Each of the conductive patterns 22a-22f may include a pad region where a corresponding contact plug is formed. The conductive patterns 22a-22f may be extended further as the conductive patterns descend so that the pad regions are not overlapped each other in a plane view. The pad region is positioned on at least one edge portion of each of the conductive patterns 22a-22f.

The conductive patterns 22a-22f may include metallic materials. The metallic materials used for the conductive structure may include tungsten (W), aluminum (Al), copper (Cu), etc. These metallic materials may be used alone or in combination.

An upper insulating interlayer 16 covering the conductive structure is provided.

Contact holes 30 are formed through the upper insulating interlayer 16 to expose upper surfaces of each of the conductive patterns 22a-22f.

In some exemplary embodiments, a buffer conductive pattern 28 and a contact plug 34 may be filled in some contact holes 30. In addition, only the contact plug 34 may be filled in some contact holes 30.

The buffer conductive pattern 28 includes a metallic material selectively deposited on the exposed conductive pattern. The contact plug 34 includes a metallic material formed under a blank deposition condition. The process conditions for the selective deposition and the blanket deposition will be further explained later.

In an exemplary embodiment of the inventive concept, the buffer conductor pattern 28 and the contact plug 34 may include a common metallic material. However, the buffer conductive pattern 28 and the contact plug 34 are formed under the different deposition process conditions, so the buffer conductive pattern 28 and the contact plug 34 may have different crystalline structure from each other. The metallic material used for the buffer conductive pattern 28 and the contact plug 34 may include tungsten (W), aluminum (Al), or copper (Cu).

The buffer conductive pattern 28 need not be provided on at least an exposed lowermost conductive pattern 22a in the contact hole 30. That is, only a contact plug 34 is formed on the exposed lowermost contact pattern 22a in the contact hole 30.

FIGS. 2 to 9 are cross-sectional views illustrating a method of manufacturing the contact structure shown in FIG. 1.

As shown in FIG. 1, conductive structures are provided on the substrate 10, in which the insulating interlayer patterns 12a-12g and the conductive patterns 22a-22f are laminated in a multi-layer structure. The following description will be made on the assumption that the conductive patterns are laminated in six layers. However, the number of laminated layers in the conductive patterns 22a-22f may not be limited thereto, but any number of laminated layers in the conductive patterns 22a-22f may be used.

The conductive patterns 22a-22f may include metallic materials. For example, the conductive patterns 22a-22f may include tungsten (W), aluminum (Al), and copper (Cu). Hereinafter, a method of manufacturing the contact structure of FIG. 1 will be explained using tungsten (W) as metallic material for the conductive patterns 22a-22f.

The conductive structure may be formed in various methods, and a method of forming the conductive structure is not limited as explained below. The following is an example of fanning the conductive structure.

Figure 2:
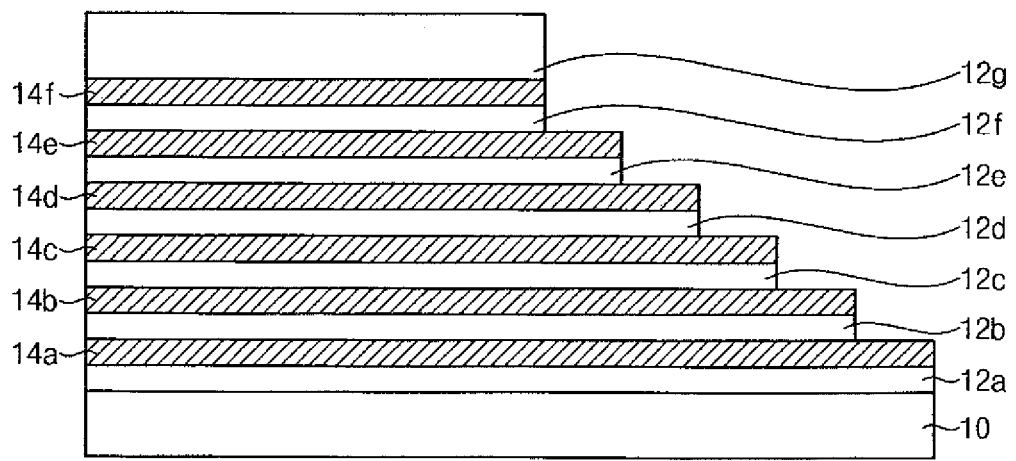

First, as shown in FIG. 2, insulating interlayers (not shown here) and sacrificial layers (not shown here) are sequentially and repeatedly laminated on the substrate 10. The insulating interlayers may include silicon oxide. The sacrificial layers may include a material having etch selectivity with respect to the insulating interlayer. The sacrificial layers may include a material such as silicon nitride or polysilicon.

A step-shaped mold structure having insulating interlayer patterns 12a-12g and conductive patterns 22a-22f, which are alternately laminated, may be formed by a photolithography processing to the insulating interlayer and the sacrificial layer. The photolithographic process and an etching process may be repeatedly performed, and the step-shaped mold structure is formed.

Figure 3:
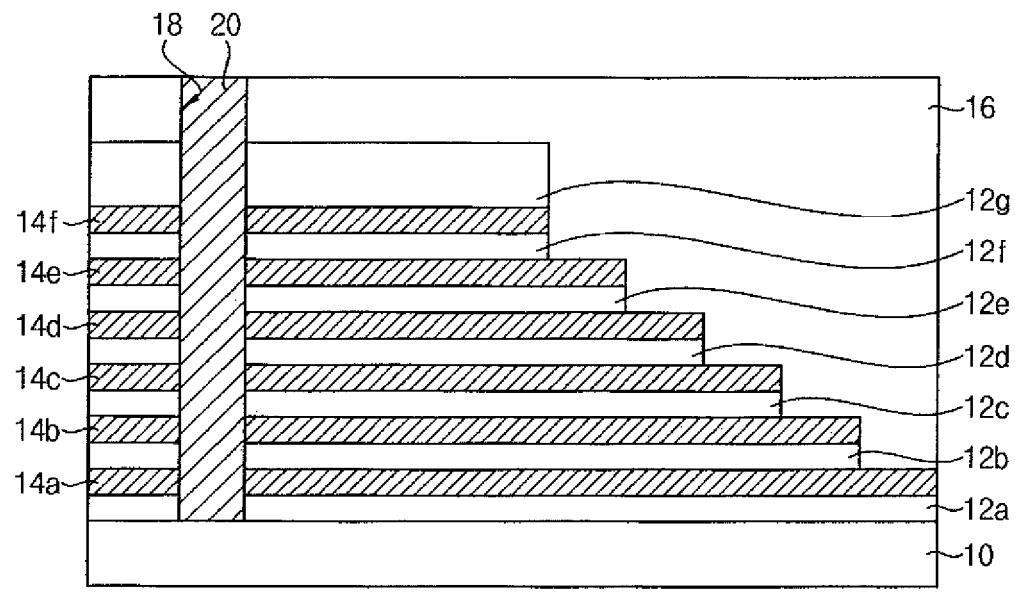

As shown in FIG. 3, the upper insulating interlayer 16 may be formed on the step-shaped mold structure of FIG. 2. A planarizing process is performed to planarize an upper surface of the upper insulating interlayer 16. The planarizing process may include chemical mechanical polishing (CMP) or an etch-back process.

Holes 18 are formed by partially etching the mold structure and the upper insulating interlayer 16. After that, a pillar-shaped support pattern 20 is formed in the holes 18. The support pattern 20 includes a semiconductor pattern. For instance, the semiconductor pattern may be provided as a channel layer.

Figure 4:
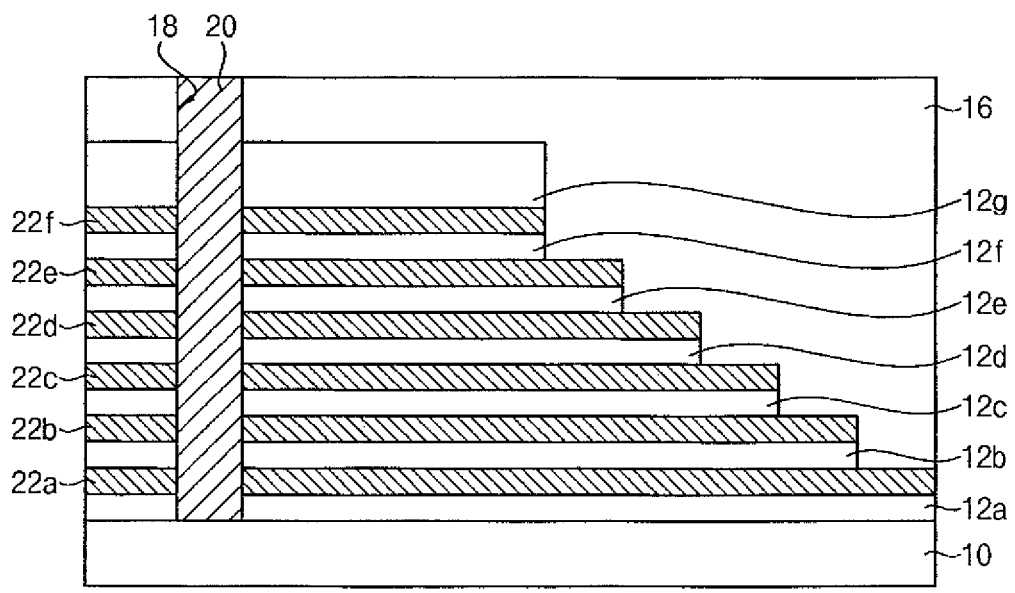

As shown in FIG. 4, trenches (not shown here) are formed by partially etching the mold structure and the upper insulating interlayer 160. The trenches are located in parallel to each other in the direction toward an edge pad region, and the trenches are not shown in FIG. 4.

The sacrificial layer patterns 14a-14f exposed to sidewalls of the trenches are all removed to form grooves (not shown) between the trenches. In this case, the insulating interlayer patterns 12a-12g are supported by the support pattern 20.

The conductive patterns 22a-22f are formed to fill the groove portion. For example, the sacrificial patterns 14a-14f are replaced with the conductive patterns 22a-22f. Thus, the conductive patterns 22a-22f are formed between the insulating interlayer patterns 22a-22f. An insulating pattern (not shown) is formed in the trench.

As described above, the conductive patterns 22a-22f may include tungsten (W), aluminum (Al), or copper (Cu).

Figure 5:
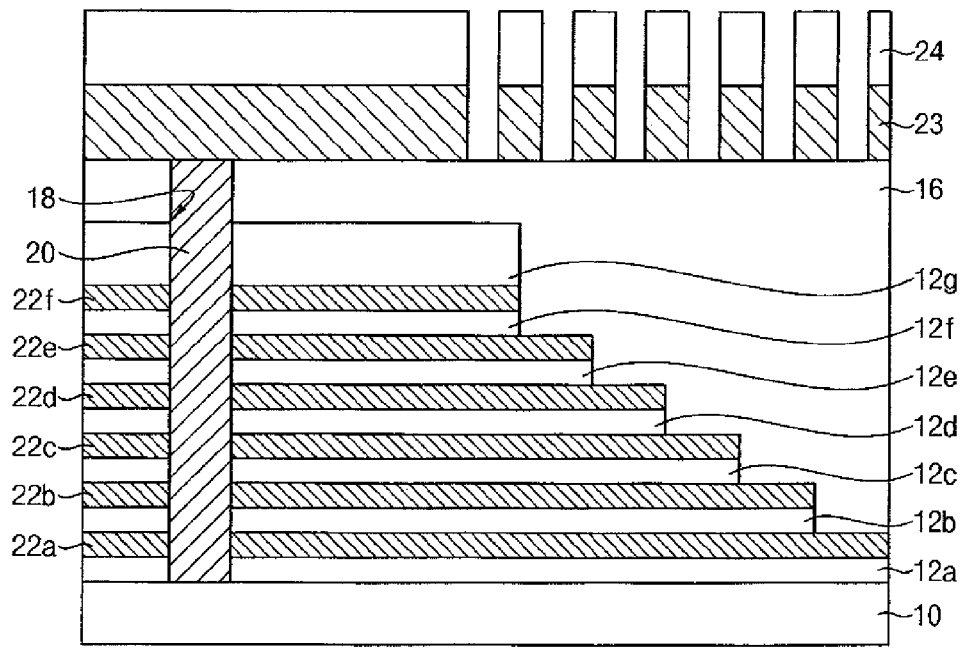

Referring to FIG. 5, a hard mask layer (not shown here) is formed on the upper insulating interlayer 16. The hard mask layer may include a material having etch selectivity with respect to the insulating interlayer. The hard mask layer may include a material on which nucleation sites for depositing a metal are rarely formed during a subsequent selective metal thin film forming process. Accordingly, the hard mask layer may be formed using an amorphous carbon layer (ACL) or a silicon nitride layer (SiN).

A single photolithographic process is performed on the hard mask layer using a photoresist pattern 24. The photoresist pattern 24 exposes part of the hard mask layer to form a hard mask pattern 23. The part of the hard mask layer is aligned with contact holes which will be formed later using the hard mask pattern 23.

Figure 6:
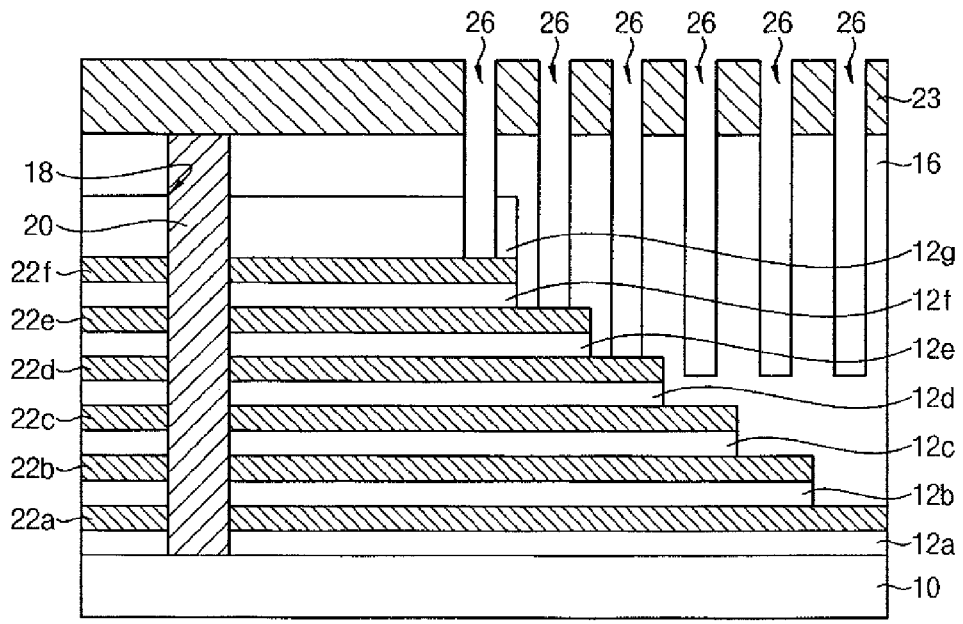

The hard mask pattern 23 may be formed for forming contact holes 26 of FIG. 6 using a single photolithographic process. The hard mask layer is etched by using the photoresist pattern 24 as an etch mask to form the hard mask pattern 23. The hard mask pattern 23 is formed, exposing upper surfaces of the upper insulating interlayer 16 corresponding to all contact holes 26 of FIG. 6. For example, although the contact holes 26 of FIG. 6 have various depths, such contact holes 26 are formed using the same hard mask pattern 23 formed using a single photolithographic process.

Referring to FIG. 6, a first step etching process may be performed using the mask pattern 23. The upper insulating interlayer 16 and the insulating interlayer pattern 12g are etched to a first predetermined maximum depth to form contact holes 26. Some of the contact holes 26 have depths less than the first predetermined maximum depth, exposing upper surfaces of an uppermost conductive pattern 22f and a plurality of conductive patterns 22e and 22d below the uppermost conductive pattern 22f. Other contact holes 26 have the first predetermined maximum etch depth and may have closed bottoms without exposing upper surfaces of the conductive patterns. For example, for the first predetermined maximum depth, upper surfaces of first three upper conductive patterns 22f-22d are exposed. However, the contact holes 26 do not expose upper surfaces of remaining lower conductive patterns 22c-22a.

In the first step etching process, while the upper insulating interlayer 16 and the insulation interlayer pattern 12g are etched, the conductive patterns 22f-22d exposed may be slightly etched due to high etch selectivity with respect to the upper insulating interlayer 16. For example, the etch selectivity of the conductive patterns 22f-22d with respect to the upper insulating interlayer 16 is 1:40 or above. Since the higher etch selectivity is beneficial, there is no upper limit of the etch selectivity. However, the exemplary embodiments are also applicable for a case where the etch selectivity-is less than 1:40.

The first step etching process will be explained step by step below. First, a leftmost contact hole 26 may be formed by etching the upper insulating interlayer 16 and the insulating interlayer 12g, exposing an upper surface of an uppermost sixth conductive 22f. After that, while the contact hole 26 next to the leftmost contact hole 26 is formed by etching remaining portion of the upper insulating interlayer 16, the sixth conductive pattern 22f may be slightly etched. The contact hole 26 next to the leftmost contact hole 26 may expose an upper surface of a fifth conductive pattern 22e. In addition, the fifth and sixth conductive patterns 22e and 22f may be slightly etched while the other portion of the insulating interlayer is etched to the first maximum etch depth forming a third contact hole from the leftmost contact hole 26 and exposing an upper surface of the fourth conductive pattern 22d. As shown in the drawing, the first step etching process may etch the upper insulating interlayer 16 to the first predetermined maximum etch depth, and the first to third conductive patterns 22a-22c below the first predetermined maximum etch depth are not exposed by the contact holes 26, but only fourth to sixth conductive patterns 22d-22f are exposed.

In the first step etching process, when the first predetermined maximum etch depth is too large, the sixth conductive pattern 22f may be overetched to have some defects. Accordingly, in the first step etching process, the first predetermined maximum etch depth may be determined so that the uppermost conductive pattern 22f may have a sufficient thickness to remain in the contact hole 26 while the upper insulating interlayer 16 is etched to the first predetermined maximum etch depth. For example, the contact holes 26 exposing upper surfaces of the conductive patterns 22f-22d may have various etch depth less than the first predetermined maximum etch depth, because the conductive patterns 22f-22d have etch selectivity with respect to the upper insulating interlayer 16. The first predetermined maximum etch depth may determine the number of conductive patterns whose upper surfaces are be exposed in the first step etching process.

Although the exemplary embodiments illustrate that the first step etching process exposes upper surfaces of three conductive patterns 22f-22d from the uppermost position, for example, upper surfaces of the sixth, fifth, and fourth conductive patterns 22f, 22e, and 22d, the number of the conductive patterns exposed through the first step etching process is not limited thereto. For example, if each of the conductive patterns 22a-22f has a larger thickness, the number of the conductive patterns—exposed through the first step etching process may be increased.

After that, the photoresist pattern 24 of FIG. 5 may be removed using ashing and strip processes.

Figure 7:
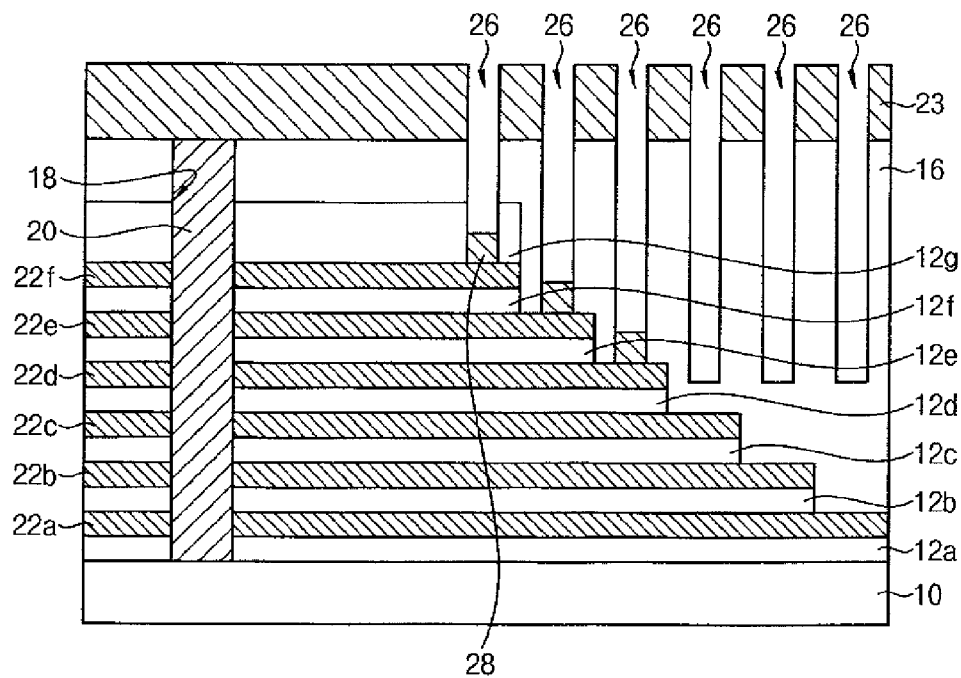

Referring to FIG. 7, buffer conductive patterns 28 are formed on the exposed conductive patterns 22d-22f by performing a selective metal deposition process. In the selective metal deposition process, nucleation sites for depositing a metallic material are exclusively formed on the exposed conductive patterns. For example, nucleation sites for depositing a metallic material are formed on fourth to sixth conductive patterns 22d-22f exposed in the contact hole 26, so that deposition of a metallic material does not occur other than the exposed conductive patterns 22d-22f. To selectively deposit a metallic material on the exposed conductive patterns, the metallic material must be deposited only through a surface reaction where a source gas including the metallic material reacts only with the exposed upper surfaces of the conductive patterns 22d-22f.

The buffer conductive pattern 28 may protect conductive patterns 22d-22f under the buffer conductive pattern 28 from a subsequent second step etching process. Accordingly, the buffer conductive patterns 28 may have thickness sufficient to protect the conductive patterns 22d-22f during the second step etching process. For example, a combined thickness of a buffer conductive pattern 28 and a conductive pattern 22d-22f under the buffer conductive pattern 28 is greater than an etching thickness of the buffer conductive pattern 28 and the conductive pattern 22d-22f under the buffer conductive pattern 28 etched in the second step etching process. For example, the buffer conductive pattern 28 may have a thickness in the range of about 200 Å to about 500 Å. If the buffer conductive pattern 28 has a thickness less than about 200 Å, the lower conductive patterns 22d-22f may be overetched. In contrast, when the buffer conductive pattern 28 has a thickness more than about 500 Å, the buffer conductive pattern 28 may remain on a final contact structure after the second step etching process.

The buffer conductive pattern 28 may include tungsten (W), aluminum (Al), or copper (Cu). Hereinafter, a method of manufacturing the contact structure of FIG. 1 will be explained in which tungsten (W) is used as the buffer conducting pattern 28.

First, in order to selectively deposit tungsten buffer conducting patterns 28, the tungsten may be deposited only on upper surfaces of the conductive patterns 22d-22f through a surface reaction using tungsten source gas. For example, nucleation sites for depositing the tungsten buffer conducting patterns 28 are formed only on the upper surfaces of the conductive patterns 22d-22f. Deposition by a vapor reaction may be suppressed in the selective deposition of the tungsten buffer conducting patterns 28. To this end, the deposition process condition may be controlled so that the tungsten is deposited only through a surface reaction of the exposed conductive patterns 22d-22f with tungsten source gas. The process of selectively depositing the tungsten may be performed at the temperature in the range of 200° C. to 350° C., which allows nucleation sites for depositing the tungsten to be formed only on the exposed upper surfaces of the conductive patterns 22d-22f. When the deposition temperature is less than about 200° C., nucleation sites are rarely formed. When the deposition temperature is higher than about 350° C., a vapor-phase reaction may occur or nucleation sites are formed on the upper insulating interlayer 16 other than the upper surfaces of the conductive patterns 22d-22f. As a result, tungsten is deposited in blanket deposition, so the tungsten may be formed not only on the upper surfaces of the conductive patterns 22d-22f, but also on other portions such as the upper insulating interlayer 16 and the mask pattern 23. Therefore, the process is performed at the temperature in the range of about 200° C. to about 350° C. for the selective deposition of the tungsten buffer conducting patterns 28.

For example, the tungsten buffer conductive patterns 28 are formed by using the exposed conductive patterns 22d-22f of the contact hole 26 as a seed layer. When the conductive patterns are formed of tungsten (W), nucleation sites may be selectively formed on the tungsten (W) conductive patterns in the temperature range of 200° C. to 350° C. In the process of forming the tungsten buffer conductive patterns 28, $WF_6$ gas may be used as a source gas and hydrogen may be used as a reducing agent using the exposed conductive patterns 22d-22f as a seed layer.

When the foregoing process is performed, each of buffer conductive patterns 28 are formed on the exposed sixth, fifth, and fourth conductive patterns 22f, 22e, and 22d in the contact hole 26. The buffer conductive patterns 28 are not formed on the unexposed lower conductive patterns 22a-22c in the contact holes 26.

Figure 8:
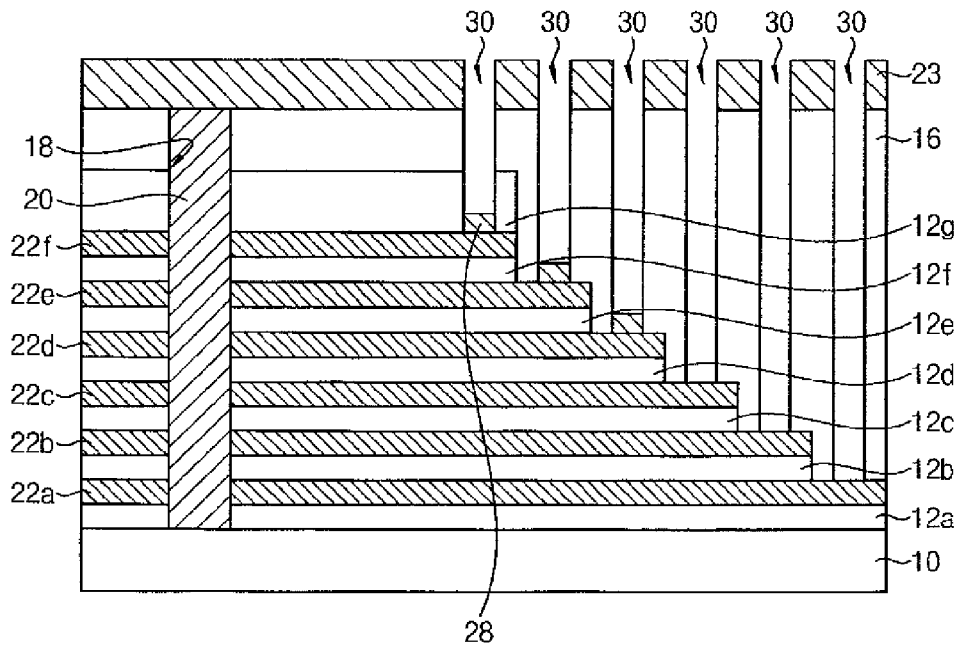

Referring to FIG. 8, the exposed upper insulating interlayer 16 in the contact hole 26 is secondarily etched by using the same hard mask pattern 23 as an etch mask to form contact holes 30. The second step etching process is performed so that the upper surfaces of the conductive patterns 22a-22c, which are not exposed through the first step etching process, may be exposed. In the second step etching process, the conductive patterns 22d-22f are slightly etched while the upper insulating interlayer 16 is mainly etched to form the contact holes 30.

In the second step etching process, the buffer conductive patterns 28 may protect the conductive patterns 22d-22f under the buffer conductive patterns 28. For example, in the second step etching process, the buffer conductive patterns 28 are etched, and depending on process conditions, the conductive patterns 22d-22f under the buffer conductive pattern 28 may be partially etched. Accordingly, after the second step etching process is completed, conductive patterns 22d-22f having the sufficient thickness may remain in the contact holes even if the buffer conductive pattern 28 is partially or fully removed. If the etch depth is determined, the number of the conductive patterns 22a-22f whose upper surfaces are exposed through the second step etching process may be determined.

For example, in the second step etching process, contact holes 30 may be formed using the same mask pattern 23 as used in the first step etching process, exposing upper surfaces of remaining conductive patterns 22c-22a, sequentially. The contact holes 26 of FIG. 7 may be extended down to expose upper surfaces of the remaining conductive pattern 22a-22c. The upper surfaces of the buffer conductive patterns 28 may be partially or fully removed in the second step etching process. For example, the buffer conductive pattern 28 formed on the uppermost conductive pattern 22f may be removed to a greater extent than the other buffer conductive patterns 28, because etch gases may be introduced to a greater extent into the contact hole having the lowest aspect ratio.

In an exemplary embodiment of the inventive concept, as shown in FIG. 8, the buffer conductive patterns 28 may remain after the second step etching process has been performed. Depending on process conditions, some of the buffer conductive patterns 28 may be removed from the contact holes 30, or all of the buffer conductive patterns 28 may be removed from the contact holes 30.

In addition, the hard mask pattern 23 may be partially removed in the first and the second step etching processes.

In the present exemplary embodiment, the contact holes 30 are formed until an upper surface of a lowermost conductive pattern 22a are exposed through the first and the second step etching processes. However, the number of etching processes may not be limited to the two steps etching processes as explained above. When the number of the conductive patterns 22a-22f increases, additional etching and selective metal deposition processes may be further required to form the contact holes using the same mask pattern 23.

Figure 9:
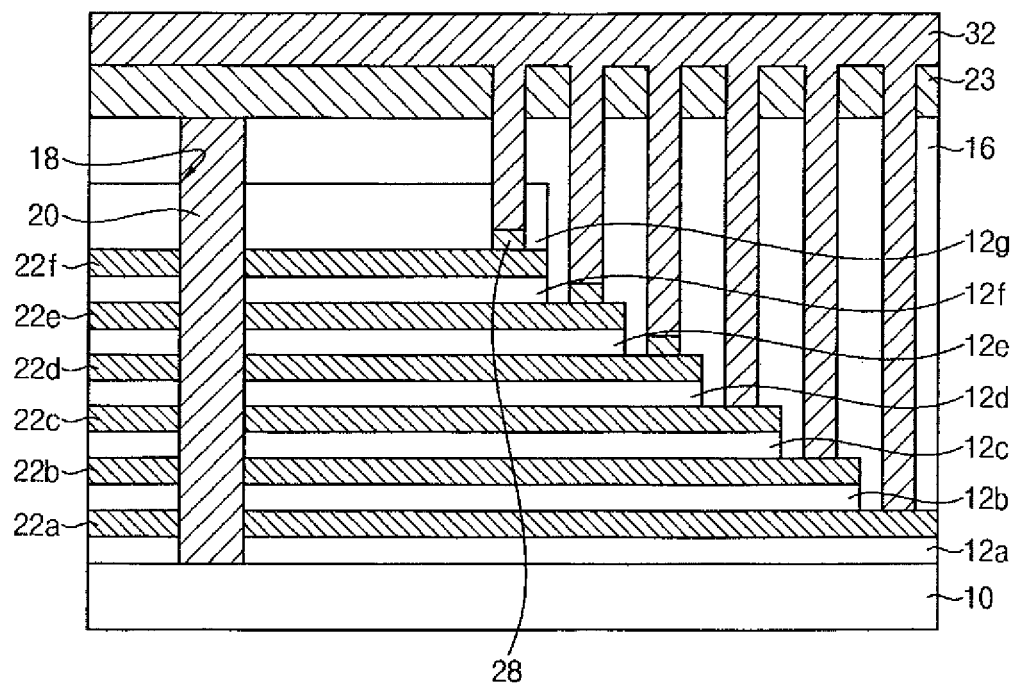

Referring to FIG. 9, a barrier metal layer (not shown) and a metal layer 32 are deposited in the contact hole 30.

The barrier metal layer may include titanium, titanium nitride, tantalum, tantalum nitride, or tungsten nitride. A material used for the metal layer 32 may include tungsten, copper, or aluminum. A process of depositing the metal layer 32 may include chemical vapor deposition, physical vapor deposition, or electroplating.

The metal layer 32 is deposited to fill up the contact hole 30 and on the hard mask pattern 23. For example, the metal layer 32 is not selectively deposited, but is entirely deposited under a blanket deposition process condition.

For example, the metal layer 32 is formed of tungsten using a chemical vapor deposition under a blanket deposition process condition. In the blanket deposition process condition, the process is performed at the temperature in the range of about 400° C. to about 600° C. To form the tungsten metal layer, a nucleation process is first performed to form a nucleation layer (not shown here) including nucleation sites on the upper insulating interlayer 16 and the mask pattern 23. The nucleation layer is formed through the nucleation process by using $WF_6$ gas as a source gas and $SiH_4$ or $B_2H_6$ gas as a reducing agent. After that, the tungsten metal layer 32 is formed by using $WF_6$ gas as a source gas and $H_2$ as a reducing agent.

Referring back to FIG. 1, contact plugs 34 filling the contact holes 30 are formed by planarizing the barrier metal layer and the metal layer 32. In the planarizing process, the hard mask pattern 23 may also be removed.

In the contact structure formed by the process, the buffer conductive pattern 28 is not formed in the contact hole 30 formed by a final etching process.

In the contact structure formed by the process, the buffer conductive pattern 28 may remain in at least a part of an upper contact hole. Accordingly, the buffer conductive pattern 28 and the contact plug 34 may fill up in some contact holes. The buffer conductive pattern 28 and the contact plug 34 may include the common material. However, although the buffer conductive pattern 28 and the contact plug 34 include the common material, the buffer conductive pattern 28 is formed under a selective deposition condition using the surface reaction of the conductive pattern in contact hole with the metallic material, and the contact plug 34 is formed under a blanket deposition condition using the vapor-phase reaction and the surface reaction of the conductive pattern in contact hole with the metallic material.

As described above, since the buffer conductive pattern 28 and the contact plug 34 have different deposition conditions, the buffer conductive pattern 28 and the contact plug 34 may have different crystalline structures.

Through the above process, the hard mask pattern is formed only through one photo process so that contact holes may be formed in a plurality of layers. Further, the failure of the contact holes due to over etch may be decreased.

Figure 10:
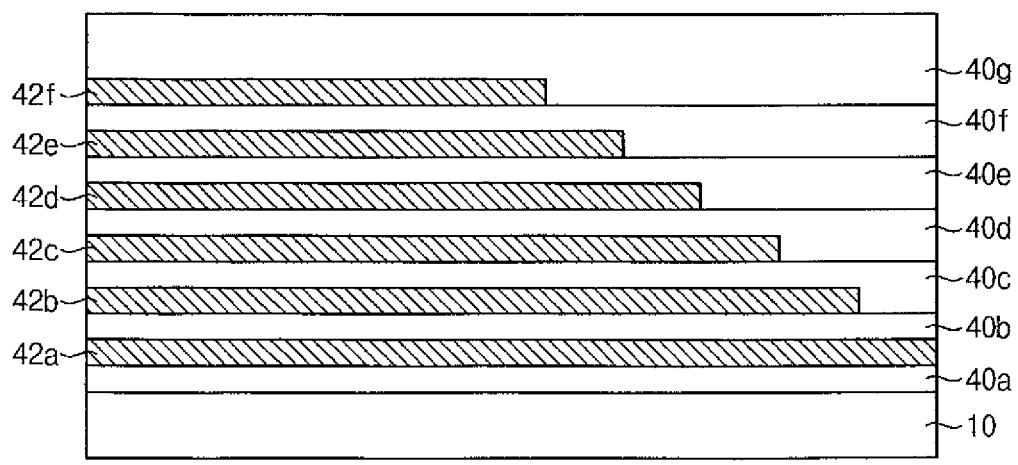
Figure 11:
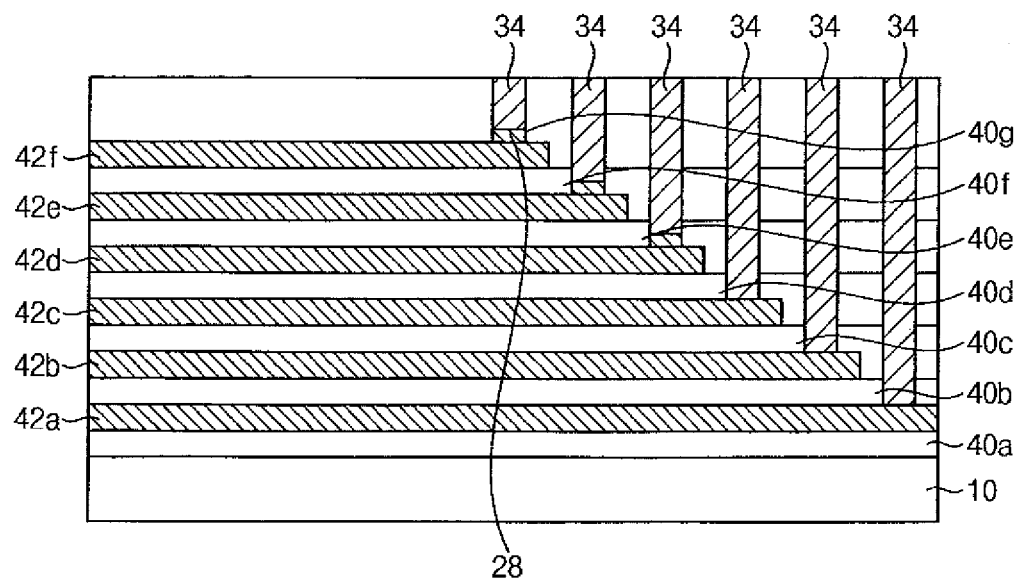

FIGS. 10 and 11 are cross-sectional views illustrating a method of manufacturing a contact structure in accordance with an exemplary embodiment of the inventive concept.

Hereinafter, a method of forming the contact structure according to an embodiment of the inventive concept will be described.

The method described below is substantially identical to the method described above except for the process of forming the conductive structures. Thus, etching and selective deposition procedures to form the contacts are substantially identical to those of the foregoing embodiment.

Referring to FIG. 10, an insulating interlayer 40a and a conductive pattern 42a are formed on a substrate 10. The conductive pattern 42a may be formed through a photolithographic process or a damascene process. The conductive pattern 42a may include metallic materials. For instance, the conductive pattern 42a may include tungsten, aluminum, or copper.

After that, conductive structures is formed by repeatedly forming the insulating interlayers 40a-40g and the contact patterns 42a-42f. The insulating interlayers 40a-40g and contact patterns 42a-42f are laminated on the substrate 10 as a multi-layer structure to form the conductive structures.

An edge portion of each of the conductive patterns 42a-42f provides a pad region on which a contact plug is formed. As shown in FIG. 10, the edge portion of each of the conductive patterns 42a-42f may have a step shape having a step height between upper and lower portions thereof. For example, the length of each of conductive patterns 42a-42f in the lateral direction is gradually reduced as the contact patterns 42a-42f ascend from the lowermost contact pattern 42a to the uppermost contact pattern 42f.

After that, the same processes described with reference to FIGS. 4 to 9 are performed. Accordingly, the contact structure shown in FIG. 11 may be formed.

The contact structure may be placed in a connection region of a memory device.

Figure 12:
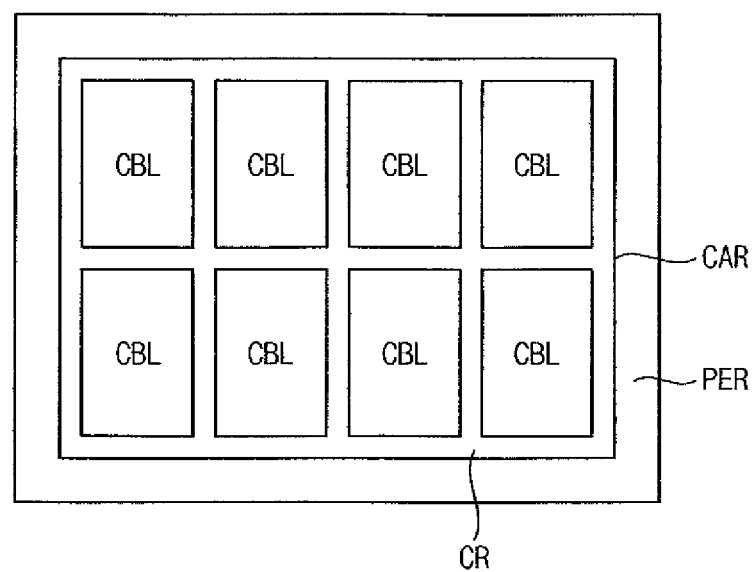
Figure 13A:
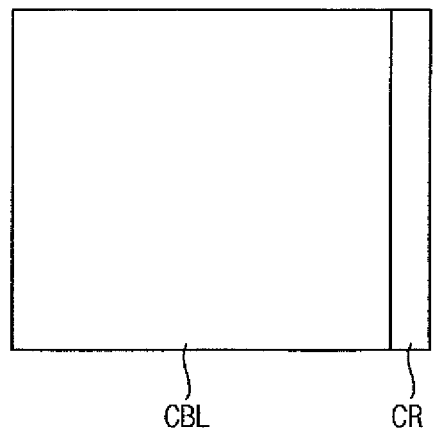
FIGS. 13A to 13C are plan views illustrating the arrangement of a cell block and a connection region in a cell region shown in FIG. 12.
Figure 13B:
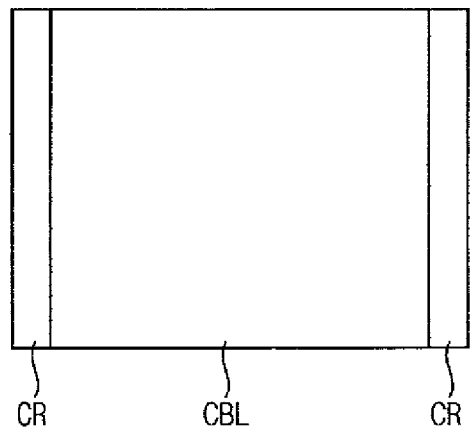
Figure 13C:
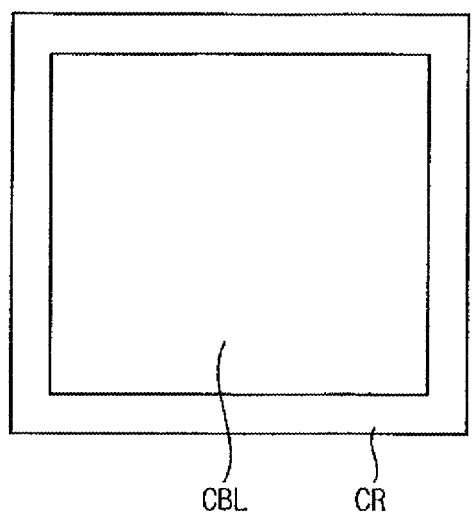

FIG. 12 is a plan view illustrating the arrangement of cells in a memory device. FIGS. 13A to 13C are plan views illustrating the arrangement of a cell block and a connection region in a cell region shown in FIG. 12.

Referring to FIG. 12, a memory device includes a cell array region CAR and a peripheral circuit region PER in which circuits for operating memory cells are arranged.

The cell array region CAR may include cell blocks CBL and a connection region CR. Each of cell blocks CBL includes memory cells connected to conductive lines extending from the memory cells to the connection region CR.

The connection region CR may be disposed in various ways as shown in FIGS. 13A to 13C. For example, as shown in FIG. 13A, the connection region CR may be disposed in one side of the cell block CBL. As shown in FIG. 13B, the connection region CR may be arranged in both sides of the cell block CBL facing each other. As shown in FIG. 13C, the connection region CR may surround the cell block CBL.

For a vertical memory device, memory cells may be vertically laminated in the cell block CBL. The memory cells may include vertically laminated conductive patterns which receives independent electric signals. To this end, the conductive patterns must have a shape horizontally extending to the connection region CR, and contact plugs are formed on the conductive patterns in the connection region. For example, a contact structure as shown in FIG. 1 or 11 may be provided in the connection region CR of the vertical memory device.

FIGS. 14 to 24 are cross-sectional views illustrating a method of manufacturing a contact structure in accordance with an exemplary embodiment of the inventive concept.

Figure 14:
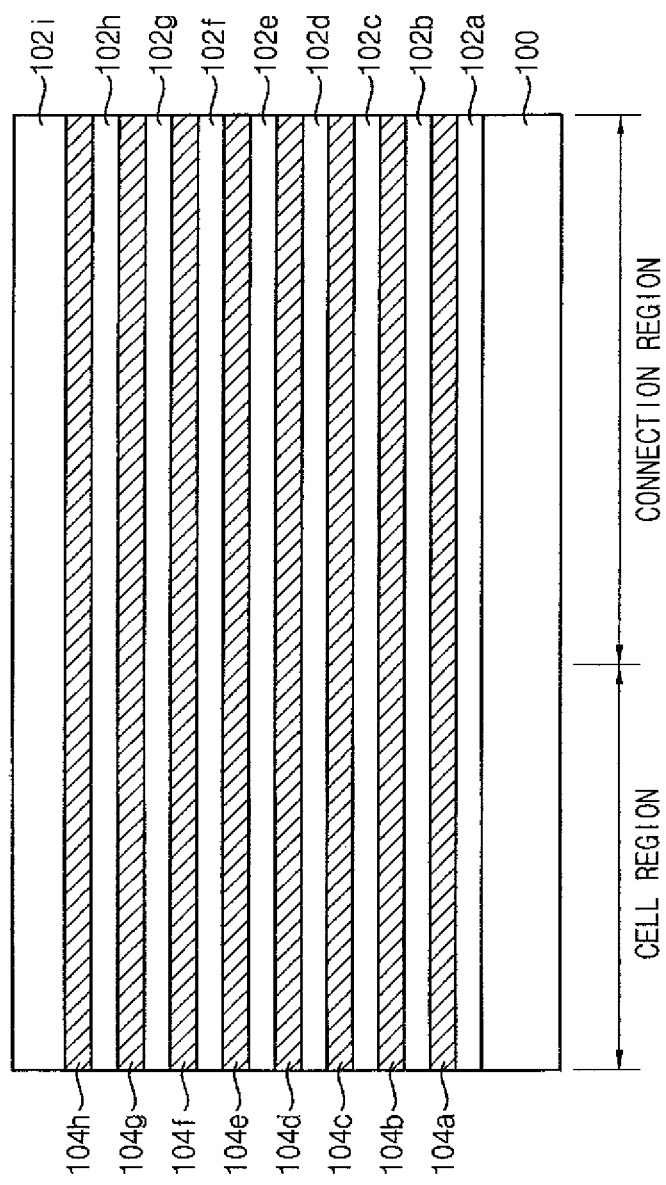

Referring to FIG. 14, a semiconductor substrate 100 is prepared. The semiconductor substrate 100 is divided into a cell region provided with memory cells and a peripheral region provided with peripheral circuits. The cell region includes a cell formation region and a connection region. The cell formation region includes the memory cells and the connection region includes wires eclectically connected to the memory cells. The semiconductor substrate 100 may include a single crystalline silicon substrate.

Insulating interlayers 102a-102i and sacrificial layers 104a-104h are sequentially and repeatedly laminated on the semiconductor substrate 100. The insulating interlayers 102a-102i may be formed by depositing silicon oxide layers. The sacrificial layers 104a-104h may include a material having etch selectivity with respect to the insulating interlayers 102a-102i. For example, the sacrificial layers 104a-104h may be formed of silicon nitride layers.

In an exemplary embodiment, the sacrificial layers 104a-104h have an eight-layered structure and the insulating interlayers 102a-102i have a nine-layered structure. The actual number of the layers need not be limited thereto, but any number of the layers may be used.

Figure 15:
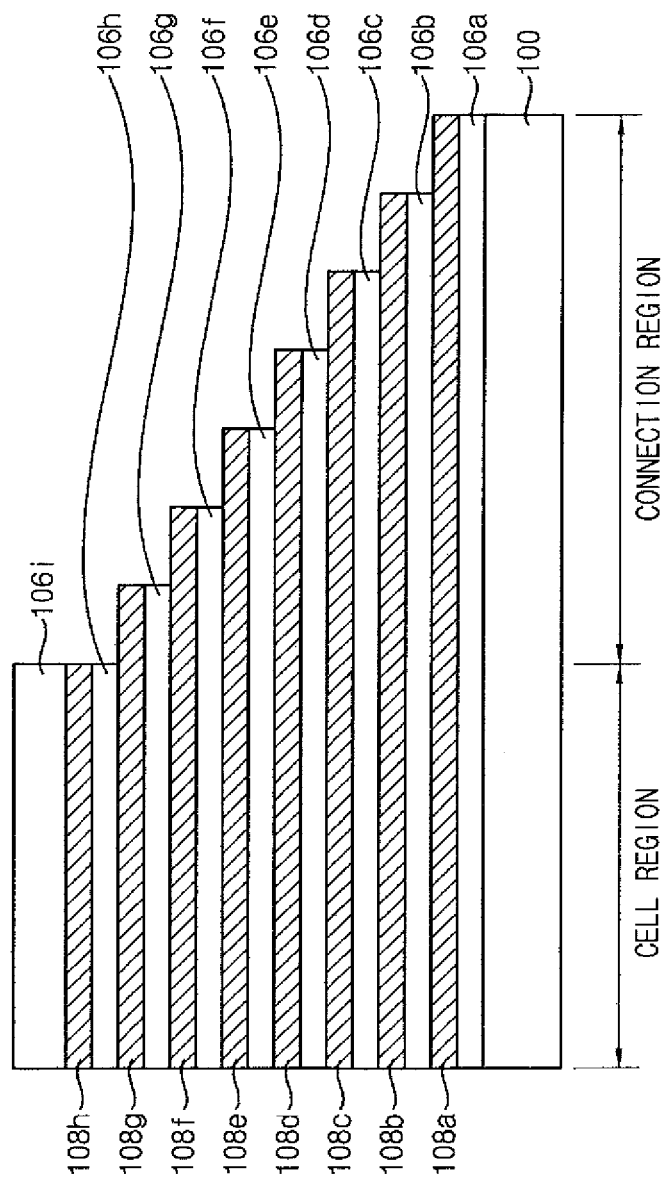

Referring to FIG. 15, a conductive structure is formed by repeating a photolithographic process several times according to an exemplary embodiment of the inventive concept. Each of the photolithographic process may pattern a step. For example, a first photolithographic process may pattern a first step by etching insulating interlayer patterns 106i and 106h and a sacrificial layer pattern 108h. A second photolithographic process may pattern a second step by etching a sacrificial layer pattern 108g and an insulating interlayer pattern 106g. The second step may be extended further into the connection than the first step. By repeating a photolithographic process until the lowermost insulating interlayer pattern 106a and the sacrificial layer pattern 108a are patterned, the insulating interlayer patterns 106a-106i and the sacrificial layer patterns 108a-108h may include a step-shaped structure in the connection region, where the steps may be extended further as the steps descend. As a result, the conductive structure may include an distal end portion having the step-shaped structure in the connection region and may provided pad regions which are not overlapped each other due to the stepped end structure. The step-shaped structure may include insulating interlayer patterns 106a-106i and sacrificial layer patterns 108a-108h laminated on the substrate.

Figure 16:
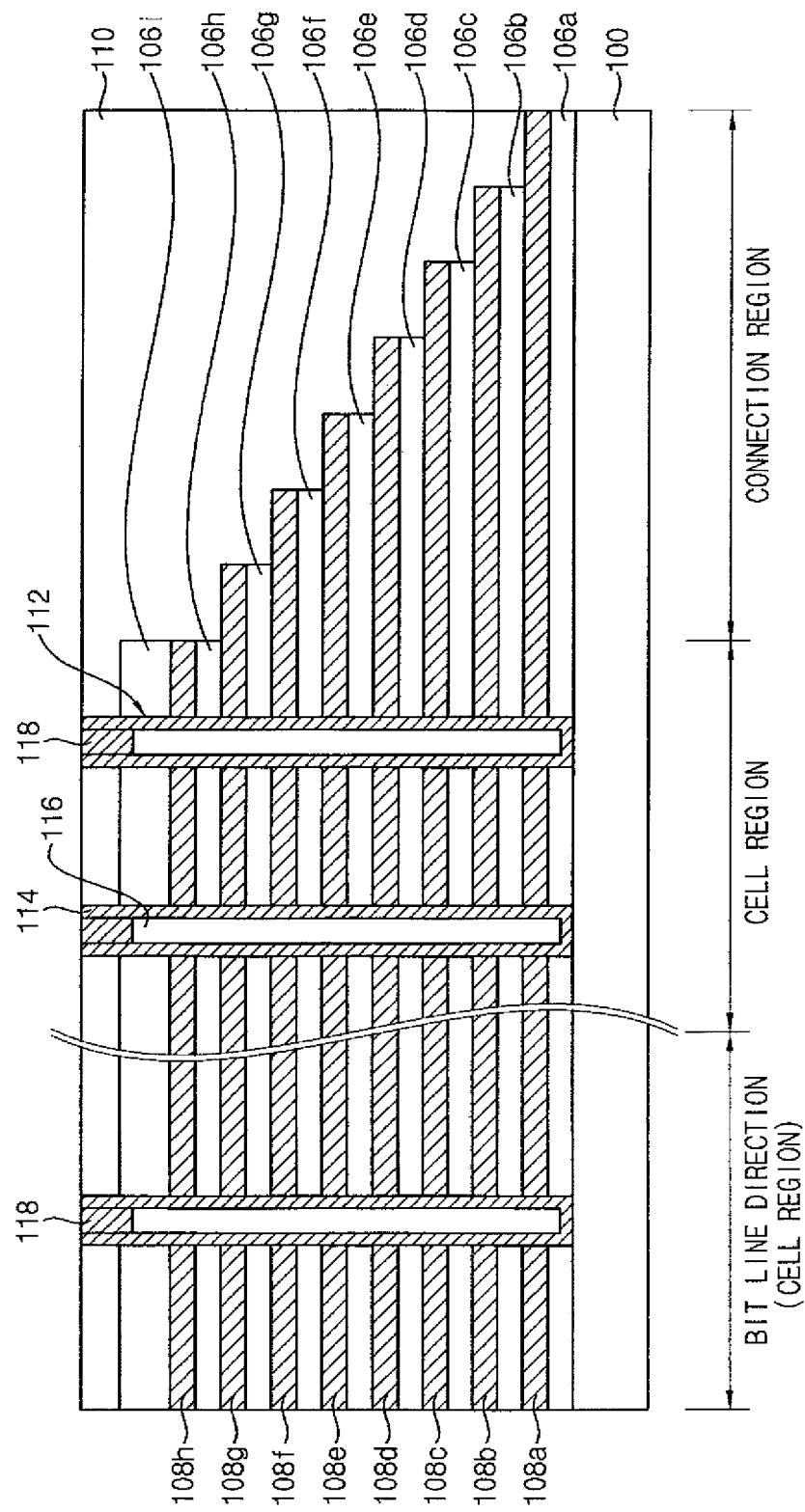

Referring to FIG. 16, an upper insulating interlayer 110 may be formed on the resulting structure of FIG. 15. The upper insulating interlayer 110 may be formed by a silicon oxide layer. A planarizing process is performed to planarize an upper surface of the upper insulating interlayer 110.

An etch mask pattern (not shown) for forming a channel hole 112 is formed on the upper insulating interlayer 110. Using the etch mask pattern as an etch mask, the upper insulating interlayer 110, insulating interlayer patterns 106a-106i, and sacrificial layer patterns 108a-108h are sequentially etched to form a plurality of channel holes 112. The channel holes 112 may expose an upper surface of the substrate 100. The channel holes 112 may be disposed in series.

A channel layer 114 is conformally formed on sidewalls of the channel holes 120, the upper surface of the substrate 100 in the channel holes 120, and the upper insulating interlayer 110. The channel layer 114 may be formed of a semiconductor material. For example, the channel layer 114 may include doped polysilicon, single crystalline silicon or amorphous silicon.

A buried insulating layer (not shown) is formed on the channel layer 114, filling up the channel hole 112. After that, the buried insulating layer is partially etched except in the channel hole 112, thereby forming a buried insulating layer pattern 116. Next, the channel layer 114 formed on the upper insulating interlayer is removed. Accordingly, the channel layer 114 is formed along a sidewall of a channel hole and a surface of the substrate in the channel hole.

After an upper portion of the buried insulating layer pattern 116 is partially etched, a semiconductor layer (not shown) is formed on the buried insulating layer pattern 116, the channel layer 114, and the upper insulating interlayer 110. The semiconductor layer is formed of the same material as that of the channel layer 114. After that, the semiconductor layer is removed to an upper surface of the upper insulation interlayer 110 so that a semiconductor pattern 118 is formed in the channel hole 112.

In an exemplary embodiment of the inventive concept, a channel layer (not shown) may be formed to completely fill up the channel hole 112.

Referring to FIG. 17A, opening portions 120 may be formed in the cell region by etching the insulating interlayer patterns 106a-106i and the sacrificial layer patterns 108a-108h. The opening portions 120 may have a trench shape extending in a direction in parallel with a word line. In an exemplary embodiment of the inventive concept, the opening portions 120 may have a hole shape. The opening portions 120 may be seen in a cross-sectional view taken along the bit line direction.

After forming the opening portions 120, the sacrificial layer patterns 108a-108h exposed to a sidewall of the opening portion 120 are removed to from grooves between the insulating interlayer patterns 106a-106i.

Figure 17B:
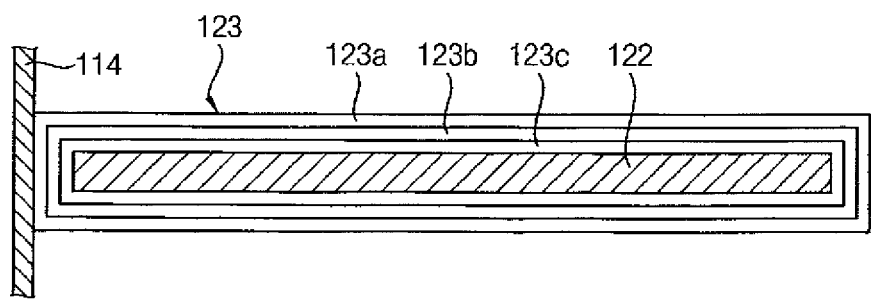

FIG. 17B is an enlarged view illustrating part A of FIG. 17A. FIG. 17B illustrates a cell structure formed on a gate electrode 122. As shown in FIG. 17B, a tunnel insulating layer 123a, a charge trap layer 123b, and a blocking dielectric layer 123c are sequentially formed along inner surfaces of the groove 123 and the opening portions 120. A conductive layer (not shown) may be formed in the opening portions 120. The conductive layer may also be formed in the groove and be formed on the blocking dielectric layer 123c. The conductive layer may be deposited using a conductive material whose step coverage characteristic is sufficient to suppress voids to form in the conductive layer. The conductive material may include metal. For instance, the conductive material may include a material having low electric resistance, such as tungsten, tungsten nitride, titanium, titanium nitride, tantalum, tantalum nitride, or platinum. In some exemplary embodiments of the inventive concept, a barrier metal layer including titanium, titanium nitride, tantalum or tantalum nitride may be formed, and then a metal layer including tungsten may be formed thereon.

After that, the conductive layer formed in the opening portion 120 is etched. The removal process may be performed through a wet etching process. By the above process, control gate electrodes 122a-122h having a dual-layer structure are formed in the groove. The control gate electrodes 122a-122h have a shape extending in one direction and are provided as word lines. In the following description, layers of the control gate electrode 122 sequentially stacked on the substrate 100 will be referred to as first to eight word lines 122a-122h. The actual number of the control gate electrode layers may not be limited thereto, but any number of the control gate electrode layers may be used. For example, sixteen word lines or more may be stacked depending on design choice. Particularly, when the number of stacked word lines is increased, a method of forming a contact hole to be described later may be useful.

The word lines 122a-122h may include stepped ends located in the connection region. Upper surfaces of the stepped ends may be used as pad regions connected to contact plug (not shown).

An impurity region (not shown) used as a source line S/L is formed by doping N type impurities into the exposed substrate 100 in the opening portion 120 among the first to eighth word lines 122a-122h.

An insulating layer pattern 124 is formed by forming an insulating layer (not shown) to fill up the opening portion 120 and planarizing the insulating layer by a polishing process. A second upper insulating interlayer 126 is formed on the channel layer 114, the insulating layer pattern 124 and the upper insulating interlayer 110.

After that, contact holes exposing pad electrodes of word lines are formed. Procedures of forming the contact holes are substantially the same as those illustrated in FIGS. 5 to 9, so the procedure of forming the contact holes will be briefly described below.

Figure 18:
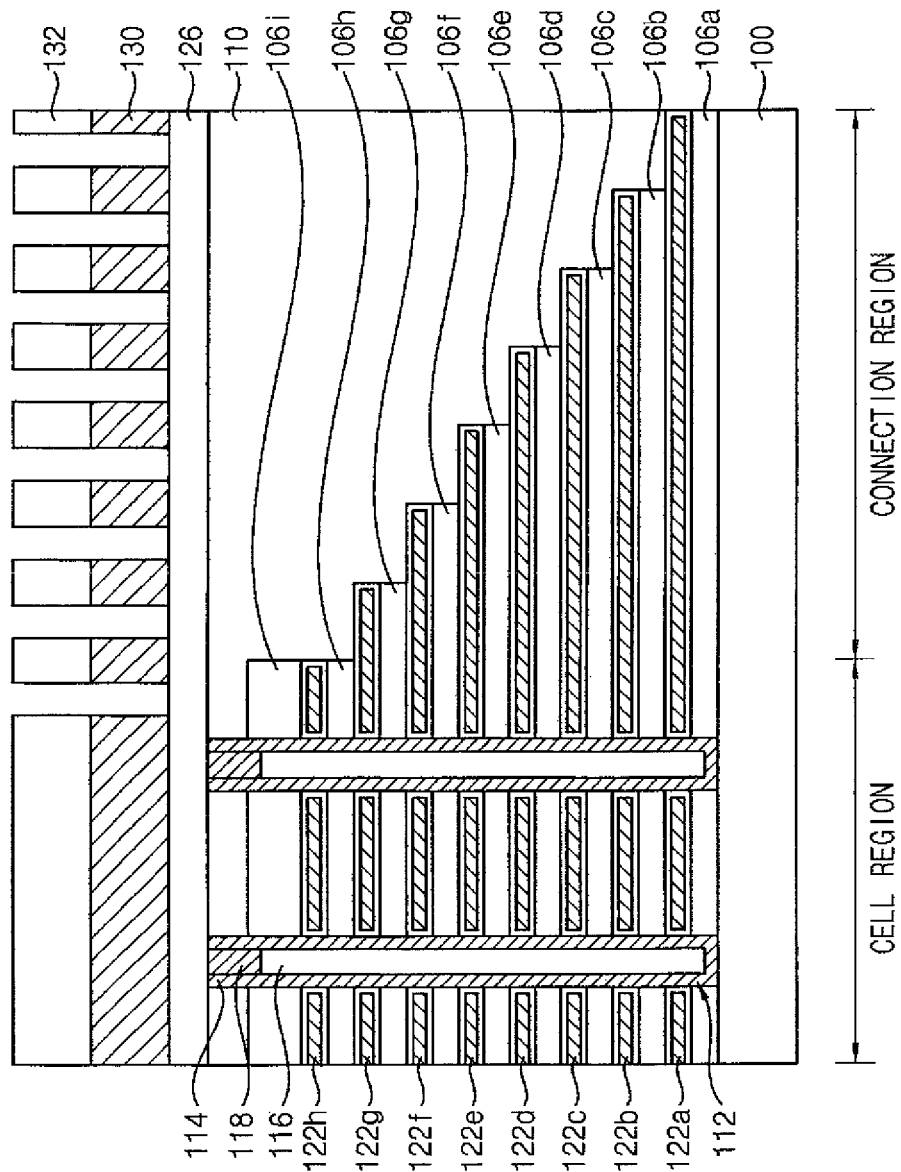

Referring to FIG. 18, a hard mask layer (not shown) is formed on the second upper insulating interlayer 126. The hard mask layer is formed by a material having etch selectivity with respect to the second upper insulating interlayer 126. The hard mask layer is formed of a material on which a metal is rarely formed in a subsequent selective metal thin film forming process. For example, the hard mask layer may be formed of an amorphous carbon layer or a silicon nitride layer.

A photoresist pattern 132 is formed by performing one photo process on the hard mask layer. The photoresist pattern 132 exposes part of the hard mask layer for forming the contact holes in the connection region.

The hard mask layer is etched by using the photoresist pattern 132 as an etch mask to form a hard mask pattern 130.

After that, the number of conductive patterns exposed through one etching process is determined, and all the conductive patterns are divided into first to $n^{th}$ conductive pattern groups from an uppermost conductive pattern to a lowermost conductive pattern according to the number of the conductive patterns.

Figure 19:
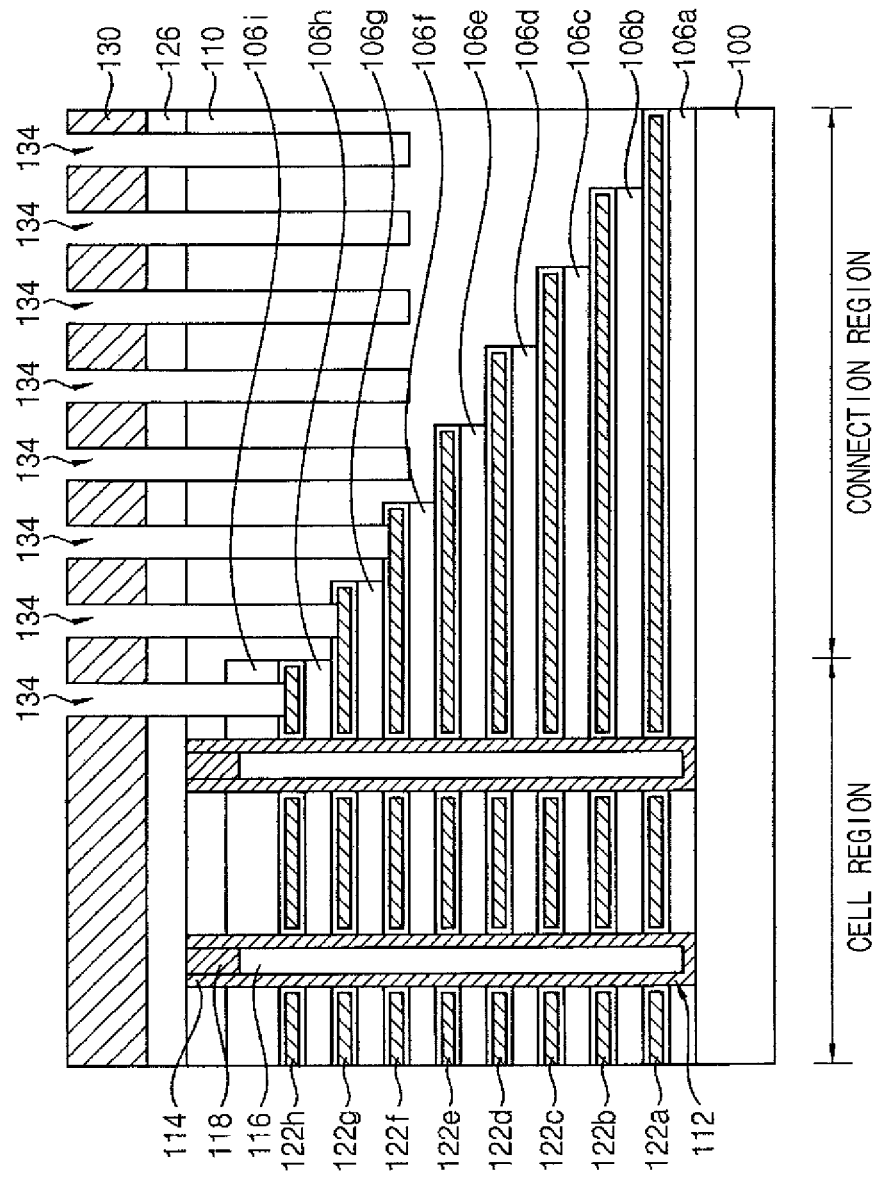

Referring to FIG. 19, a first step etching process may be performed using the mask pattern 130. The upper insulating interlayer 126 and the insulating interlayer pattern 106i are etched to a first predetermined maximum depth to form contact holes 134. Some of contact holes 134 having depths less than the first predetermined maximum depth may expose upper surfaces of an uppermost conductive pattern 122h and a plurality of conductive patterns 122g and 122f below the uppermost conductive pattern 122h. Other contact holes 134 having the maximum depth have closed bottoms without exposing upper surfaces of the conductive patterns. For example, for the first predetermined maximum depth, upper surfaces of first three upper conductive patterns 112h-122f are exposed. However, the contact holes 134 do not expose upper surfaces of remaining lower conductive patterns 122e-122a. The first group word lines may include word lines having a single-layer structure or a multi-layer structure.

Upper surfaces of word lines 122h-122f of the first group are exposed in the contact holes 134. However, the other contact holes 134 do not expose upper surfaces of word lines 122e-112a below the first predetermined maximum etch depth.

The first predetermined maximum etch depth needs to be determined such that an uppermost word line 122h is not excessively consumed, but remains with a sufficient thickness after performing the first step etching process. When the first predetermined maximum etch depth is determined, the number of layers in first group word lines 122h, 122g and 112f top surfaces of which are exposed through the first etching process may be determined.

According to an exemplary embodiment, the contact holes 134 are formed through the first etching step process, exposing upper surfaces of three layers 122h-122f from the upper position. However, upper surfaces of more or less word lines may be exposed through the first etching process. The number of the word lines exposed in the first etching step process is not limited to the above, but any number of the word lines may be exposed in the first etching step process.

Figure 20:
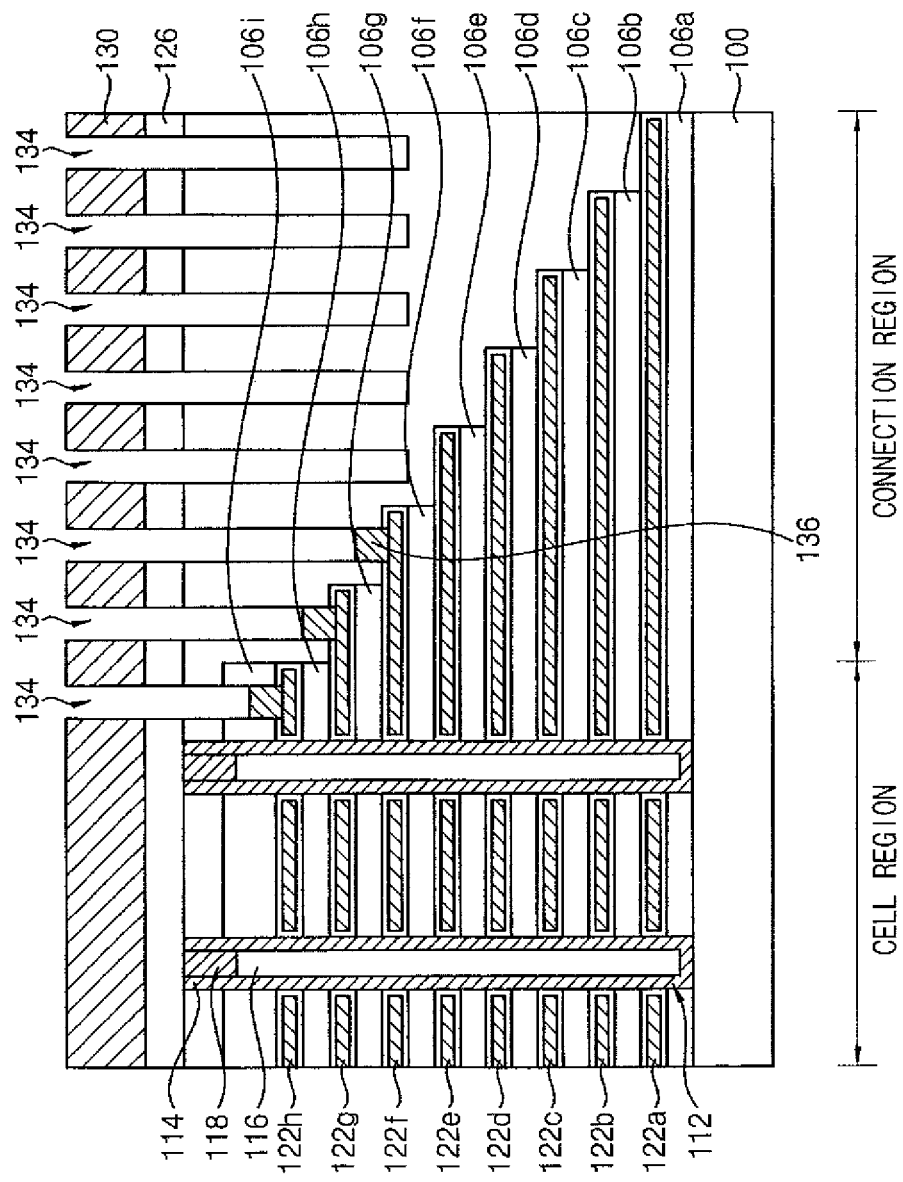

Referring to FIG. 20, first buffer conductive patterns 136 are formed on the exposed word lines 122h-122f by performing a selective metal deposition process. In the selective metal deposition process, a metallic material is selectively deposited only on exposed word lines 122h, 122g, and 122f through the contact holes 134. The procedure of forming the first buffer conductive pattern 136 is the same as that illustrated in FIG. 7, so further explanation is omitted here.

Figure 21:
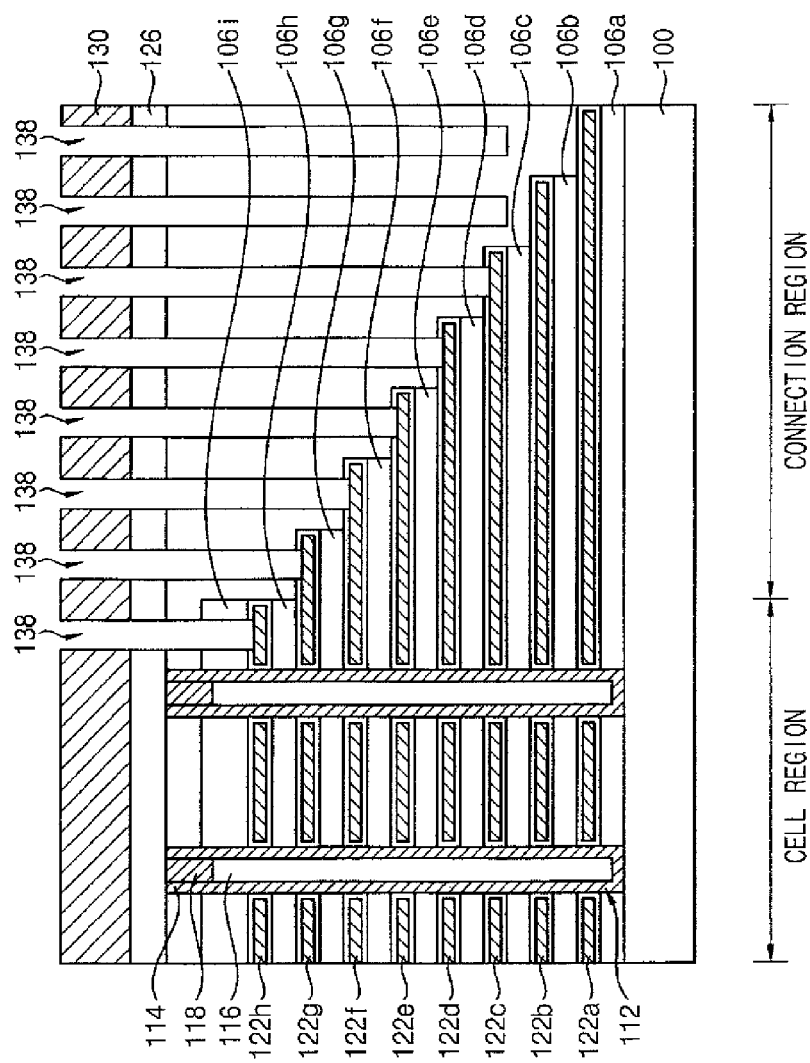

Referring to FIG. 21, the exposed upper insulating interlayer 110 in the contact hole 138 is secondarily etched by using the same hard mask pattern 130 as an etch mask to form contact holes 138. The second step etching process is performed to form contact holes having a second predetermined maximum etch depth. In the second step etching process, a second group of word lines 122e-122c, which are not exposed in the first step etching process, may be exposed. The second group word lines 122e-122c include word lines having a single-layer structure or a multi-layer structure below the first group word lines 122h-122f.

In the second step etching process, the first buffer conductive patterns 136 may be removed. In an embodiment of the inventive concept, the first buffer conductive pattern 136 may remain. In an embodiment of the inventive concept, the first buffer conductive patterns 136 may be removed and the word lines under the first buffer conductive patterns 136 may be partially etched.

In the second step etching process, the second maximum etch depth must be determined so that the first group of word lines 122h-122f under the first buffer conductive pattern 136 remains with sufficient thickness. If the second maximum etch depth is determined, the number of word lines whose upper surfaces are exposed through the second step etching process may be determined.

According to an exemplary embodiment of the inventive concept, the contact holes 138 are formed by extending the contact holes 134 of FIG. 20 downward to the second maximum etch depth through the second step etching process. Upper surfaces of the second group of word lines 122e-122c may be exposed.

Figure 22:
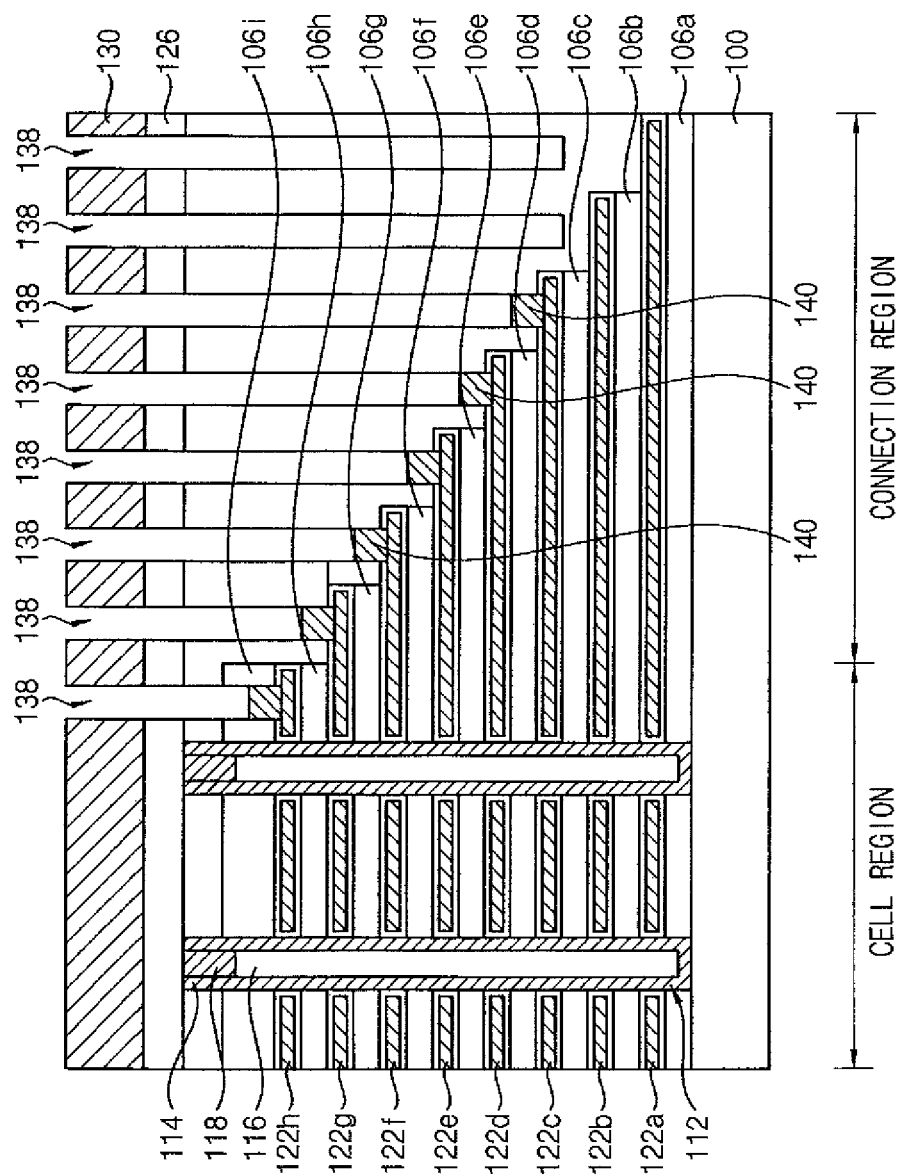

Referring to FIG. 22, the second buffer conductive patterns 140 are selectively formed on the exposed word lines 122h-122c. In an embodiment of the inventive concept where a first buffer conductive pattern remains in the second step etching process, the second buffer conductive patterns 140 may be selectively formed on the first buffer conductive patterns 136 and the exposed word lines 122e-122c in the contact holes 138.

To selectively deposit the second buffer conductive patterns 140, the second conductive patterns 140 must be formed only on the upper surfaces of the exposed word lines 122c-122h through a surface reaction. The procedure of forming the second buffer conductive pattern 140 is the same as that illustrated in FIG. 7, so further explanation is omitted here.

The second buffer conductive patterns 140 may be formed by the same material and the same process as those of the first buffer conductive patterns 136 of FIG. 20.

The second buffer conductive patterns 140 are provided to prevent word lines 122h-122c under the second buffer conductive patterns 140 from being overetched in a subsequent third step etching process. Accordingly, the second buffer conductive patterns 140 may have various thicknesses according to an etch margin of the third step etching process.

Figure 23:
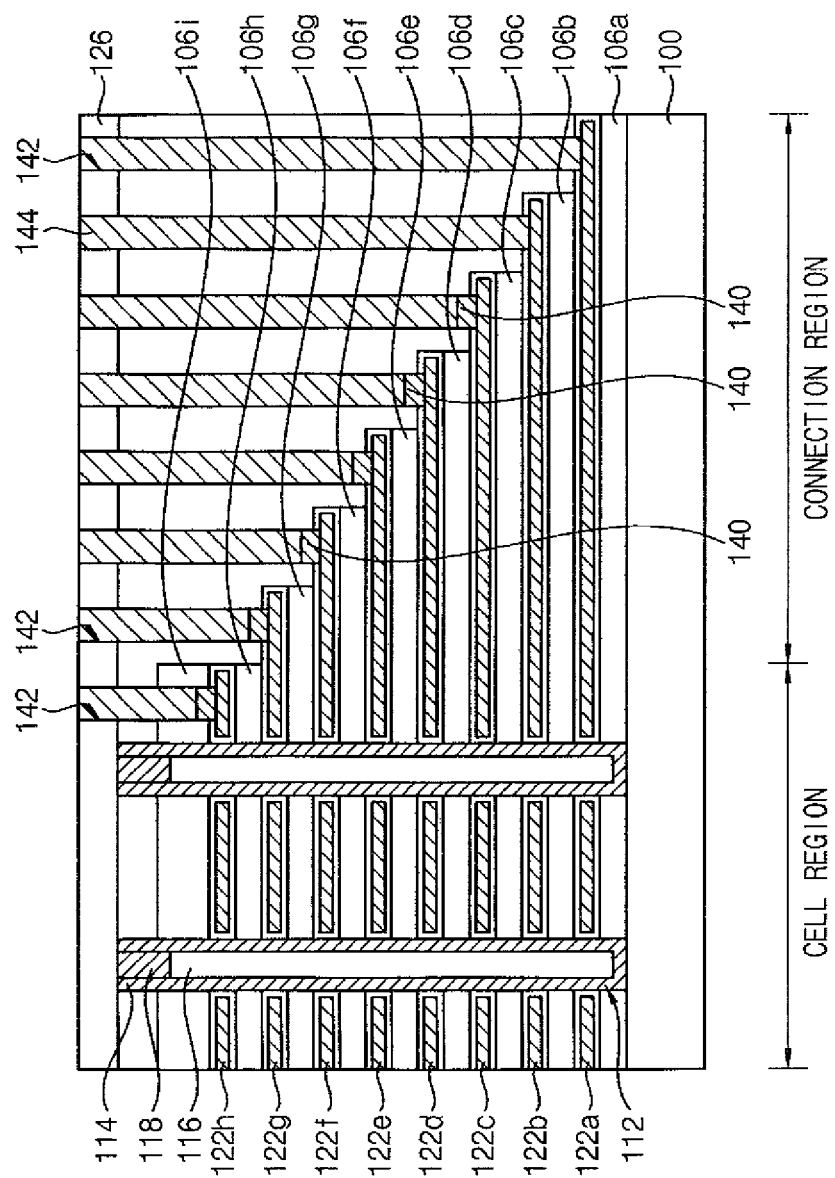

Referring to FIG. 23, the exposed insulating interlayers 100 of the contact holes 138 are etched down to a third predetermined maximum etch depth using the same hard mask pattern 130 to form contact holes 142. Through the third step etching process, the upper surfaces of the word lines 122a and 122b, which are not exposed by the second step etching process, are exposed. That is, the upper surfaces of the second and first word lines 122b and 122a are additionally exposed through the contact holes 142.

According to an exemplary embodiment of the inventive concept, the conductive patterns 112a-122h are divided into three groups of the conductive patterns 112a-122h because three partial etching processes and two selective metal depositions are performed to expose an upper surface of the lowermost conductive pattern 122a through the contact holes 142. However, the actual number of the partial etching process and the selective metal deposition process may not be limited thereto, but may change according to the number of laminated layers of the word lines included in the conductive structure.

After that, contact plugs 144 are formed in the contact holes 142 by depositing a barrier metal layer (not shown) and a metallic material layer (not shown) in the contact holes 142 and performing a planarizing process thereon.

The barrier metal layer may include titanium, titanium nitride, tantalum, tantalum nitride, or tungsten nitride. The metallic material may include tungsten, copper, or aluminum. A process of depositing the metallic material may include chemical vapor deposition, physical vapor deposition, or electroplating.

The metallic material layer is deposited on an entire surface of the contact hole and the upper surface of the hard mask pattern under a blanket deposition condition. For instance, tungsten may be formed in the contact hole using the chemical vapor deposition under a blanket deposition condition. The blanket deposition of the tungsten layer may be performed at the temperature in the range of 400° C. to 600° C. For the blanket deposition of the tungsten layer, a nucleation process is first performed. The nucleation layer is formed by using $WF_6$ gas as a source gas and $SiH_4$ or $B_2H_6$ as a reducing agent. The nucleation layer is formed on the upper insulating interlayer 110, the second upper insulating interlayer 126, and the mask pattern 138 other than the upper surfaces of the second buffer conductive patterns 140 and the first and second conductive patterns 122a and 122b. After that, bulk tungsten is formed by using $WF_6$ gas as a source gas and $H_2$ as the reducing agent.

In the contact structure manufactured by the above process, the first buffer conductive patterns 136 and the second buffer conductive patterns 140 may remain under some contact plugs. The second buffer conductive patterns 140 are formed under the selective deposition condition while the contact plugs 144 are formed under the blanket deposition condition. For this reason, the second buffer conductive patterns 140 may have a crystalline structure different from that of the contact plugs 144 which is deposited under the blanket deposition condition. When the first buffer conductive patterns 139 remain, the first buffer conductive patterns 138 may have a crystalline structure different from that of the contact plugs 144.

Meanwhile, the buffer conductive pattern 140 is not formed in the contact holes formed through a final etching process.

After that, a planarizing process is performed to completely remove the hard mask pattern 130.

Figure 24:
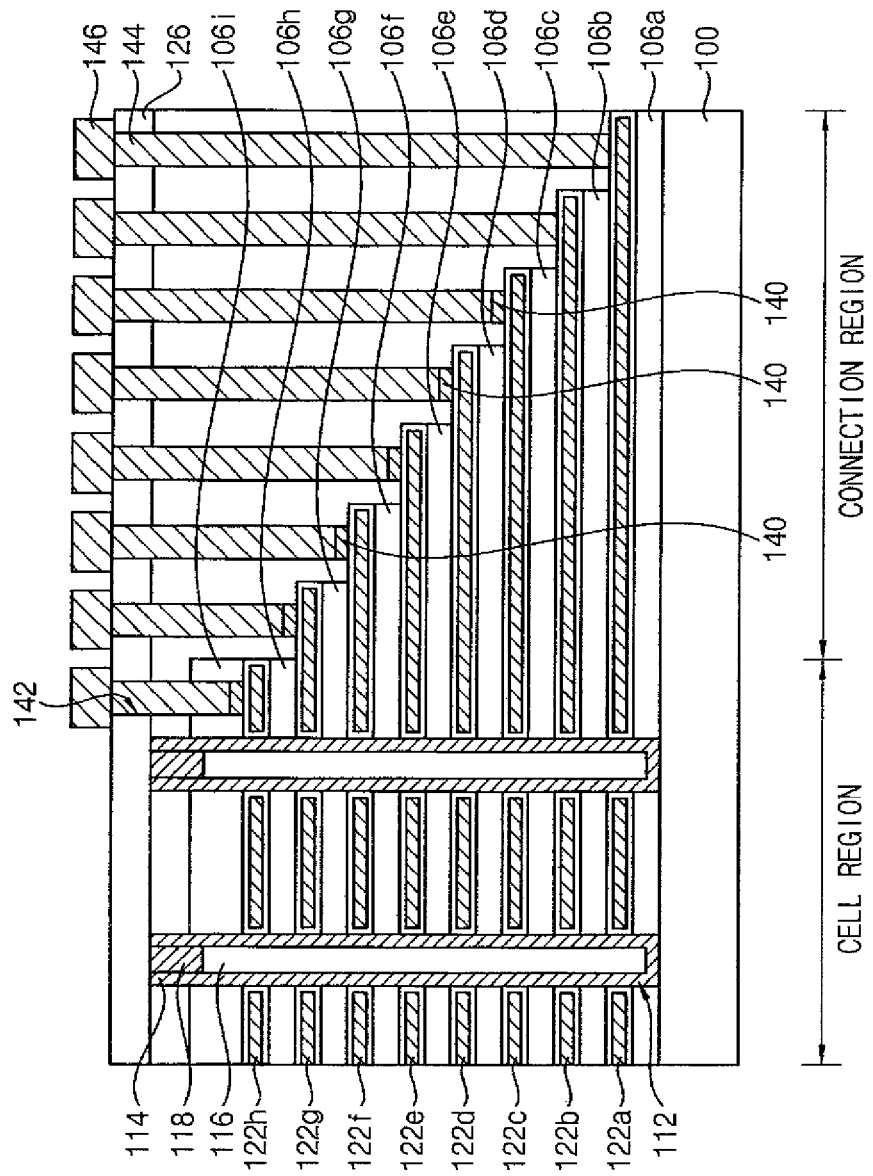

Referring to FIG. 24, wire lines 146 are formed to be in contact with upper surfaces of contact plugs 144.

Through the above process, contact plugs making contact with each of word lines laminated in a vertical direction may be formed in the connection region. Further, only one photolithographic process is used to form the contact plugs having various heights, preventing a punch through failure from occurring due to misalignment of the contact plugs.

According to exemplary embodiments, contact plugs having various heights can be easily formed using only one photolithographic process. Therefore, the method according to the exemplary embodiments may be applied to a semiconductor device including contact plugs. Particularly, the method may be applied to a semiconductor memory device having cells vertically laminated.

While the present inventive concept has been shown and described with reference to exemplary embodiments thereof, it will be apparent to those of ordinary skill in the art that various changes in form and detail may be made therefrom without departing from the spirit and scope of the inventive concept.

What is claimed is:

1. A method of manufacturing a semiconductor device, comprising the steps of:
forming a conductive structure including a plurality of insulating interlayer patterns and a plurality of conductive patterns alternately and repeatedly laminated on a substrate, wherein each of the plurality of conductive patterns includes a pad region;
forming an upper insulating interlayer on the conductive structure;
forming a hard mask pattern on the insulating interlayer, the hard mask pattern including a plurality of holes, each of the plurality of holes being aligned to the pad region, respectively;

forming first contact holes by etching the upper insulating interlayer and an uppermost insulating layer pattern of the insulating interlayer patterns using the hard mask pattern until upper surfaces of a first group of the plurality of conductive patterns are exposed;

forming first buffer conductive patterns selectively on the upper surfaces;

forming second contact holes by etching the upper insulating interlayer using the hard mask patterns and the first buffer conductive patterns until an upper surface of a lowermost conductive pattern is exposed, wherein the first buffer conductive patterns protect the first group of the conductive patterns; and forming the contact plugs by filling a conductive material in the first and the second contact holes.

2. The method of claim 1, wherein an uppermost conductive pattern exposed by one of the first contact holes remains in the step of forming first contact holes.

3. The method of claim 1, wherein the conductive patterns are extended further descending down to the lowermost conductive patterns such that pad region is not overlapped with each other.

4. The method of claim 3, further comprising:
forming third contact holes, after the step of forming first buffer conductive patterns, by etching the upper insulating interlayer using the hard mask pattern and the first buffer conductive patterns until upper surfaces of a second group of the conductive patterns are exposed, wherein the second group of the conductive patterns are disposed between the first group of the conductive patterns and the lowermost conductive pattern; and forming second buffer conductive patterns selectively on the upper surfaces of a second group of the conductive patterns.

5. The method of claim 1, wherein the hard mask pattern includes amorphous carbon or silicon nitride.

6. The method of claim 1, wherein the hard mask pattern is formed by performing a single photolithographic process.

7. The method of claim 1, wherein the step of forming of a hard mask pattern comprises:
forming a hard mask layer on the upper insulating interlayer;

forming a photoresist pattern having a plurality of photoresist pattern holes using a single photolithographic process, the each of the plurality of photoresist pattern holes is aligned to the pad region; and forming the hard mask pattern by etching the hard mask layer using the photoresist pattern.

8. The method of claim 1, wherein the first conductive patterns, the buffer conductive patterns, and the contact plugs include a common metallic material.

9. The method of claim 8, wherein the metallic material includes at least one selected from tungsten, copper, and aluminum.

10. The method of claim 1, wherein the step of forming first buffer conductive patterns comprises depositing a metallic material selectively using the upper surfaces of a first group of the conductive patterns as seed layers.

11. The method of claim 10, wherein the step of forming first buffer conductive patterns is performed under a process condition that nucleation of the first buffer conductive patterns occurs only on the upper surfaces of a first group of the conductive patterns.

12. The method of claim 11, wherein the step of forming of first buffer conductive patterns comprises depositing tungsten on the upper surfaces of a first group of the conductive patterns at a temperature in a range of about 200° C. to about 350° C. using $WF_6$ gas as a source gas and hydrogen as a reducing agent.

13. The method of claim 12, wherein the conductive patterns include tungsten.

14. The method of claim 1, wherein the step of forming the contact plugs comprises:
forming a nucleation layer on the insulating interlayer pattern and the upper insulating interlayer at a temperature in a range of about 400° C. to about 600° C. using $WF_6$ gas as a precursor and $SiH_4$ or $B_2H_6$ gas as a reducing agent; and forming a tungsten layer on the nucleation layer at a temperature in a range of about 400° C. to about 600° C. using $WF_6$ gas as a source gas and hydrogen as a reducing agent.

15. The method of claim 1, wherein the first buffer conductive patterns have a thickness sufficient to protect the conductive patterns under the first buffer conductive patterns so that the conductive patterns have a sufficient thickness after the step of forming second contact holes by etching the upper insulating interlayer.

16. The method of claim 15, wherein the first buffer conductive patterns have a thickness in a range of about 200 Å to about 500 Å.

* * * * *